(12) United States Patent
Oh et al.

(10) Patent No.: US 11,342,353 B2
(45) Date of Patent: May 24, 2022

(54) SEMICONDUCTOR MEMORY DEVICE HAVING THREE-DIMENSIONAL STRUCTURE AND METHOD FOR MANUFACTURING THE SAME

(71) Applicant: SK hynix Inc., Icheon-si (KR)

(72) Inventors: Sung Lae Oh, Cheongju-si (KR); Jin Ho Kim, Hwaseongsi (KR); Sang Woo Park, Icheon-si (KR); Sang Hyun Sung, Cheongju-si (KR); Soo Nam Jung, Seoul (KR); Chang Woon Choi, Seoul (KR)

(73) Assignee: SK hynix Inc., Icheon-si (KR)

( * ) Notice: Subject to any disclaimer, the term of this patent is extended or adjusted under 35 U.S.C. 154(b) by 29 days.

(21) Appl. No.: 16/779,599

(22) Filed: Feb. 1, 2020

(65) Prior Publication Data

US 2021/0036007 A1 Feb. 4, 2021

(30) Foreign Application Priority Data

Aug. 2, 2019 (KR) ........................ 10-2019-0094230

(51) Int. Cl.
*H01L 27/11582* (2017.01)
*H01L 21/768* (2006.01)
(Continued)

(52) U.S. Cl.
CPC .. *H01L 27/11582* (2013.01); *H01L 21/02636* (2013.01); *H01L 21/0337* (2013.01); *H01L 21/31111* (2013.01); *H01L 21/31144* (2013.01); *H01L 21/76802* (2013.01); *H01L 23/528* (2013.01); *H01L 24/05* (2013.01); *H01L 24/08* (2013.01); *H01L 25/18* (2013.01); *H01L 27/11526* (2013.01); *H01L 27/11556* (2013.01); *H01L 27/11573* (2013.01); *H01L 29/66545* (2013.01); *H01L 24/89* (2013.01);
(Continued)

(58) Field of Classification Search
None
See application file for complete search history.

(56) References Cited

U.S. PATENT DOCUMENTS

2010/0013049 A1* 1/2010 Tanaka ............. H01L 27/11575
257/532
2010/0207186 A1* 8/2010 Higashi ............ H01L 27/11575
257/314

(Continued)

FOREIGN PATENT DOCUMENTS

KR 1020180110797 A 10/2018
KR 1020210014539 A 2/2021

*Primary Examiner* — Julio J Maldonado
*Assistant Examiner* — Lawrence C Tynes, Jr.

(57) ABSTRACT

A semiconductor memory device includes an electrode structure including a plurality of electrode layers and a plurality of interlayer dielectric layers which are alternately stacked on a substrate defined with a plurality of cell areas and a plurality of coupling areas in a first direction; a hard mask pattern disposed on the electrode structure, and having a plurality of opening holes in the coupling areas; and a plurality of contact holes defined in the electrode structure under the plurality of opening holes, and exposing pad areas of the electrode layers, respectively. The plurality of opening holes are disposed by being distributed in a plurality of rows arranged in a second direction intersecting with the first direction.

14 Claims, 41 Drawing Sheets

(51) Int. Cl.
*H01L 23/00* (2006.01)
*H01L 27/11556* (2017.01)
*H01L 21/311* (2006.01)
*H01L 23/528* (2006.01)
*H01L 27/11526* (2017.01)
*H01L 25/18* (2006.01)
*H01L 21/033* (2006.01)
*H01L 21/02* (2006.01)
*H01L 29/66* (2006.01)
*H01L 27/11573* (2017.01)

(52) U.S. Cl.
CPC .......... *H01L 2224/0557* (2013.01); *H01L 2224/08147* (2013.01); *H01L 2224/80001* (2013.01); *H01L 2924/1431* (2013.01); *H01L 2924/14511* (2013.01)

(56) References Cited

U.S. PATENT DOCUMENTS

| 2016/0322374 A1* | 11/2016 | Sano | H01L 21/31111 |
| 2018/0090512 A1* | 3/2018 | Kim | H01L 21/76819 |
| 2019/0035733 A1* | 1/2019 | Park | H01L 21/76831 |
| 2020/0027893 A1* | 1/2020 | Yang | H01L 27/11548 |

\* cited by examiner

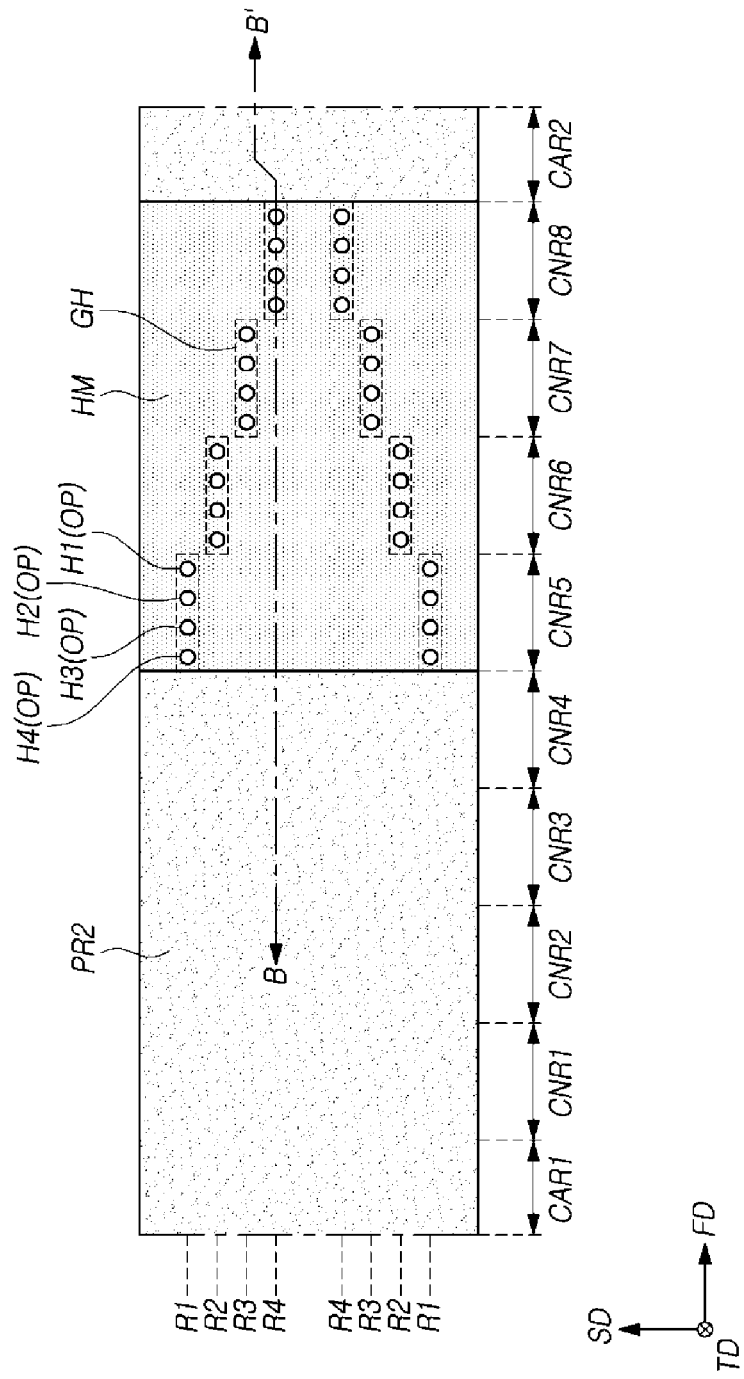

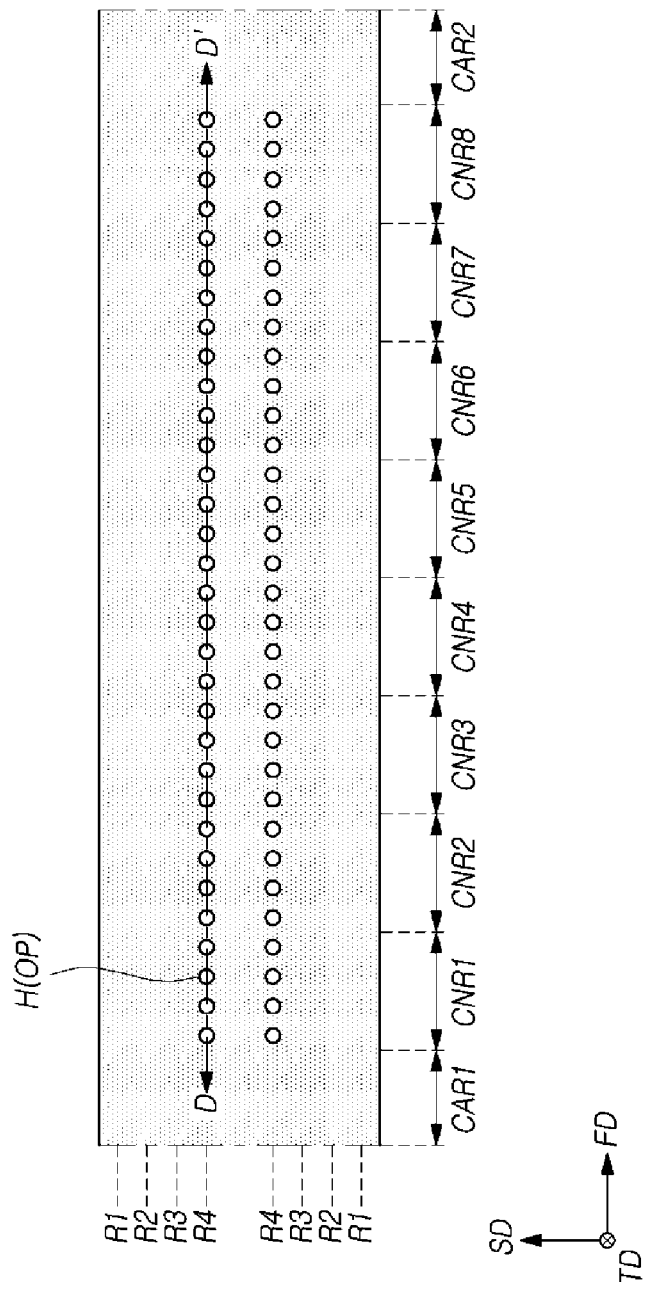

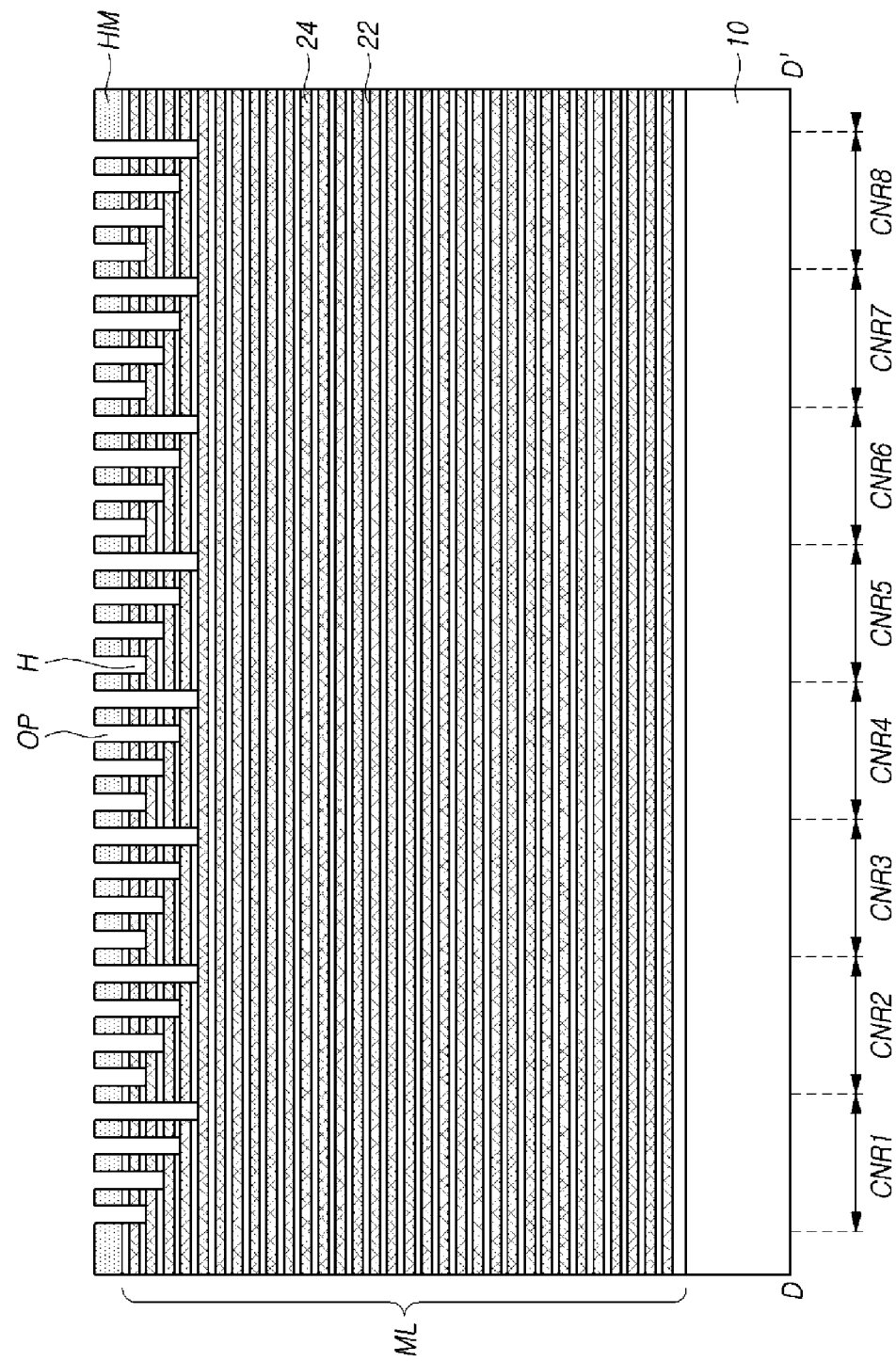

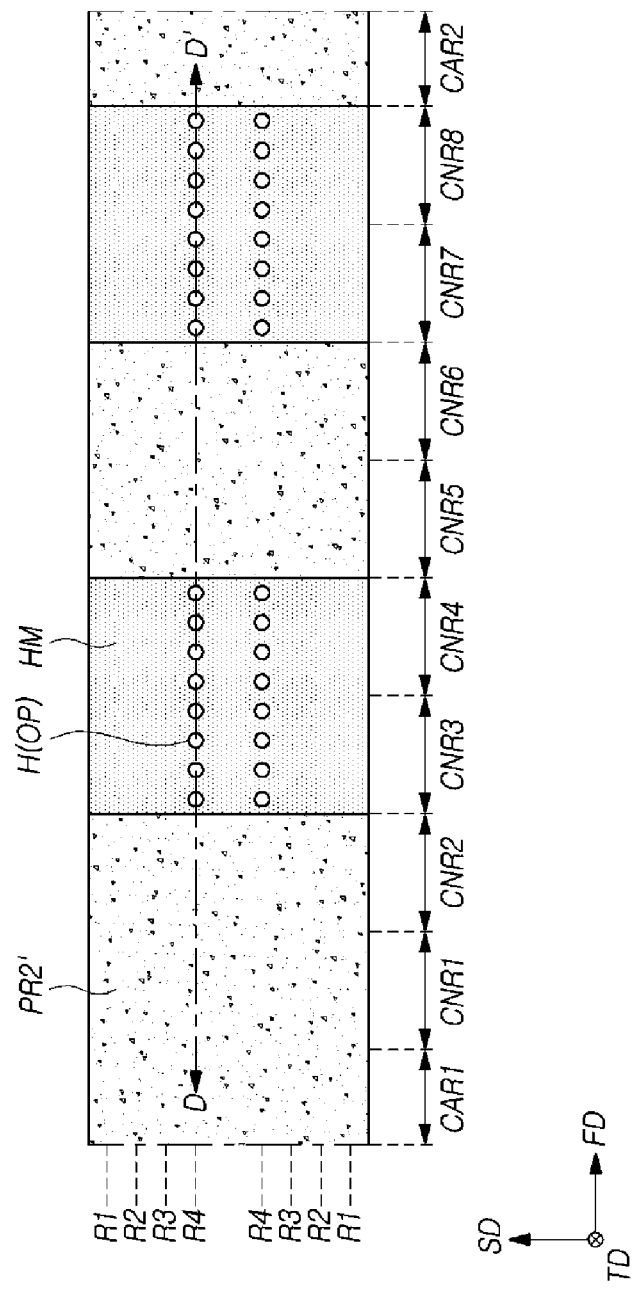

SEMICONDUCTOR MEMORY DEVICE HAVING THREE-DIMENSIONAL STRUCTURE AND METHOD FOR MANUFACTURING THE SAME

CROSS-REFERENCE TO RELATED APPLICATION

The present application claims priority under 35 U.S.C. § 119(a) to Korean Patent Application No. 10-2019-0094230 filed in the Korean Intellectual Property Office on Aug. 2, 2019, which is incorporated herein by reference in its entirety.

BACKGROUND

1. Technical Field

Various embodiments generally relate to a semiconductor memory device, and particularly, to a semiconductor memory device having a three-dimensional (3D) structure and a method for manufacturing the same.

2. Related Art

In order to meet the excellent performance and low price that consumers demand, the degree of integration of a semiconductor memory device needs to increase. Because the degree of integration of a two-dimensional (2D) or a planar semiconductor memory device is mainly determined by the area occupied by a unit memory cell, the degree of integration is greatly influenced by the level of a fine pattern forming technique. However, because substantially expensive equipment is needed for the formation of a fine pattern, the degree of integration of a two-dimensional semiconductor memory device is still limited, although it is increasing. As an alternative to overcome such a limitation, a semiconductor memory device having a three-dimensional structure including three-dimensionally arranged memory cells has been proposed.

SUMMARY

In an embodiment, a semiconductor memory device may include: an electrode structure including a plurality of electrode layers and a plurality of interlayer dielectric layers which are alternately stacked on a substrate defined with a plurality of cell areas and a plurality of coupling areas in a first direction; a hard mask pattern disposed on the electrode structure, and having a plurality of opening holes in the coupling areas; and a plurality of contact holes defined in the electrode structure under the plurality of opening holes, and exposing pad areas of the electrode layers, respectively. The plurality of opening holes may be disposed by being distributed in a plurality of rows arranged in a second direction intersecting with the first direction.

Opening holes which are disposed in the same coupling area and the same row, among the opening holes, may configure one hole group. The opening holes included in the one hole group may be continuously disposed in the first direction.

In an embodiment, a semiconductor memory device may include: a memory structure disposed over a first substrate; and a logic structure disposed over a second substrate, and including a logic circuit. The memory structure may include: an electrode structure including a plurality of electrode layers and a plurality of interlayer dielectric layers which are alternately stacked on the first substrate defined with a plurality of cell areas and a plurality of coupling areas in a first direction; a hard mask pattern disposed on the electrode structure, and having a plurality of opening holes in the plurality of coupling areas; and a plurality of contact holes defined in the electrode structure under the plurality of opening holes, and exposing pad areas of the electrode layers, respectively. The plurality of opening holes may be disposed by being distributed in a plurality of rows arranged in a second direction intersecting with the first direction.

In an embodiment, a method for manufacturing a semiconductor memory device may include: forming a stack by alternately stacking a plurality of first material layers and a plurality of second material layers on a substrate defined with a plurality of cell areas and a plurality of coupling areas arranged in a first direction; forming a hard mask pattern having a plurality of opening holes in the coupling areas on the stack, and distributing the plurality of opening holes in a plurality of rows arranged in a second direction intersecting with the first direction; forming a plurality of contact holes in an upper part of the stack exposed by the opening holes; forming a mask pattern having an opening which exposes one of the plurality of rows, on the stack; increasing depths of the plurality of contact holes disposed in the row exposed by the mask pattern, by etching the stack through a recess etching process using the hard mask pattern and the mask pattern as an etch mask; and additionally exposing one of the plurality of rows by increasing an opening area of the mask pattern through a trimming process. The recess etching process and the trimming process may be alternately and repeatedly performed.

BRIEF DESCRIPTION OF THE DRAWINGS

FIGS. 9A to 18A are top views illustrating examples of processing steps of a method for manufacturing a semiconductor memory device in accordance with an embodiment of the disclosure.

FIGS. 9B to 18B are cross-sectional views taken along the lines B-B' of FIGS. 9A to 18A in accordance with an embodiment of the disclosure.

FIGS. 14C to 16C are cross-sectional views taken along the lines C-C' of FIGS. 14A to 16A in accordance with an embodiment of the disclosure.

FIGS. 19A to 22A are top views illustrating examples of processing steps of a method for manufacturing a semiconductor memory device.

FIGS. 19B to 22B are cross-sectional views taken along the lines D-D' of FIGS. 19A to 22A in accordance with an embodiment of the disclosure.

DETAILED DESCRIPTION

Figure 1:
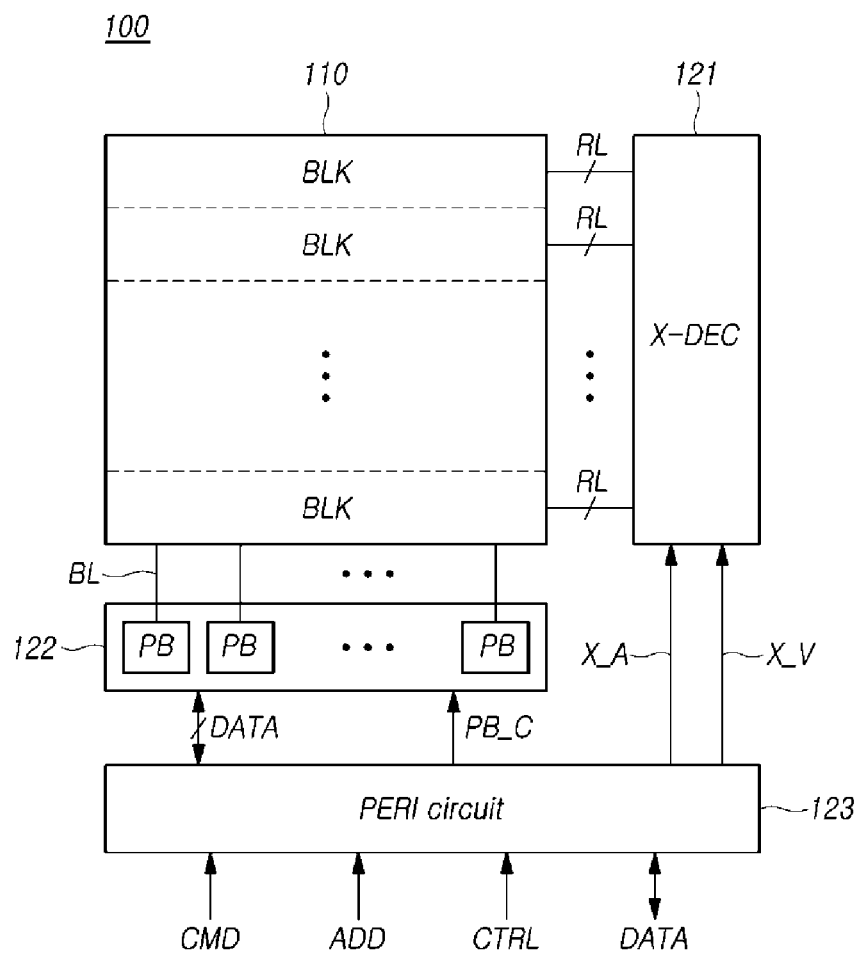
FIG. 1 is a block diagram illustrating an example of a semiconductor memory device in accordance with an embodiment of the disclosure.

Advantages and features of the disclosure and methods to achieve them will become apparent from the descriptions of exemplary embodiments herein below and described with reference to the accompanying drawings. However, the present disclosure is not limited to the exemplary embodiments disclosed herein but may be implemented in various different ways. The exemplary embodiments of the present disclosure convey the scope of the disclosure to those skilled in the art.

The figures, dimensions, ratios, angles, numbers of elements given in the drawings that describe embodiments of the disclosure are merely illustrative and are not limiting. Throughout the specification, like reference numerals refer to like elements. In describing the disclosure, when it is determined that a detailed description of the known related art may obscure the gist or the clarity of the disclosure, the detailed description thereof will be omitted. It is to be understood that the terms "comprising," "having," "including" and so on, used in the description and claims, should not be interpreted as being restricted to the means listed thereafter unless specifically stated otherwise. Where an indefinite or definite article is used when referring to a singular noun (e.g. "a," "an," "the"), the article may include a plural of that noun unless specifically stated otherwise.

In embodiments of the disclosure should be interpreted as including error margins even in the absence of explicit statements.

Also, in describing the components of the disclosure, there may be terms used like first, second, A, B, (a), and (b). These are solely for the purpose of differentiating one component from the other and do not to imply or suggest the substances, order, sequence or number of the components. Also, elements in embodiments of the disclosure are not limited by these terms. These terms are used to merely distinguish one element from another. Accordingly, as used herein, a first element may be a second element within the technical idea of the disclosure.

If a component is described as "connected," "coupled" or "linked" to another component, it may mean that the component is not only directly "connected," "coupled" or "linked" but also is indirectly "connected," "coupled" or "linked" via a third component. In describing positional relationship, such as "an element A on an element B," "an element A above an element B," "an element A below an element B" and "an element A next to an element B," another element C may be disposed between the elements A and B unless the term "directly" or "immediately" is explicitly used.

Features of various exemplary embodiments of the disclosure may be coupled, combined or separated partially or totally. Technically various interactions and operations are possible. Various exemplary embodiments can be practiced individually or in combination.

Hereinafter, a semiconductor memory device having a three-dimensional structure and a method for manufacturing the same will be described below in detail with reference to the accompanying drawings through various examples of embodiments of the disclosure.

FIG. 1 is a block diagram illustrating an example of a semiconductor memory device in accordance with an embodiment of the disclosure.

Referring to FIG. 1, a semiconductor memory device 100 in accordance with an embodiment of the disclosure may include a memory cell array 110, a row decoder (X-DEC) 121, a page buffer circuit 122 and a peripheral circuit (PERI circuit) 123.

The memory cell array 110 may include a plurality of memory blocks BLK. While not illustrated, each of the memory blocks BLK may include a plurality of cell strings. Each cell string may include at least one drain select transistor, a plurality of memory cells and at least one source select transistor, all coupled together in series. Each memory cell may be a volatile memory cell or may be a nonvolatile memory cell. While the descriptions below use a vertical NAND flash device as an example the semiconductor memory device 100, it is to be understood that the technical spirit of the disclosure is not limited thereto.

The memory cell array 110 may be coupled to the row decoder 121 through row lines RL. The row lines RL may include at least one drain select line, a plurality of word lines and at least one source select line. The memory cell array 110 may be coupled to the page buffer circuit 122 through bit lines BL.

The row decoder 121 may select any one among the memory blocks BLK included in the memory cell array 110, in response to a row address X_A provided from the peripheral circuit 123. The row decoder 121 may transfer an operating voltage X_V, provided from the peripheral circuit 123, to row lines RL coupled to a memory block BLK selected among the memory blocks BLK included in the memory cell array 110.

The page buffer circuit 122 may include a plurality of page buffers PB which are coupled to the bit lines BL, respectively. The page buffer circuit 122 may receive a page buffer control signal PB_C from the peripheral circuit 123, and may transmit and receive a data signal DATA to and from the peripheral circuit 123. The page buffer circuit 122 may control the bit lines BL, which are arranged in the memory cell array 110, in response to the page buffer control signal PB_C. For example, the page buffer circuit 122 may detect data stored in a memory cell of the memory cell array 110 by sensing the signal of a bit line BL of the memory cell array 110 in response to the page buffer control signal PB_C, and may transmit the data signal DATA to the peripheral circuit 123 depending on the detected data. The page buffer circuit 122 may apply a signal to a bit line BL based on the data signal DATA received from the peripheral circuit 123 in response to the page buffer control signal PB_C, and thereby, may write data in a memory cell of the memory cell array 110. The page buffer circuit 122 may write data in or read data from memory cells which are coupled to an activated word line.

The peripheral circuit 123 may receive a command signal CMD, an address signal ADD and a control signal CTRL from outside the semiconductor memory device 100, and may transmit and receive data DATA to and from a device outside the semiconductor memory device 100, for example, a memory controller. The peripheral circuit 123 may output signals for writing data in the memory cell array 110 or reading data from the memory cell array 110, for example, the row address X_A, the page buffer control signal PB_C and so forth, based on the command signal CMD, the address signal ADD and the control signal CTRL. The peripheral circuit 123 may generate various voltages including the operating voltage X_V, which are required in the semiconductor memory device 100.

Hereinbelow, in the accompanying drawings, two directions that are parallel to the top surface of a substrate and intersect with each other are defined as a first direction FD and a second direction SD, respectively, and a direction that vertically protrudes from the top surface of the substrate is defined as a third direction TD. For example, the first direction FD may correspond to the extending direction of word lines, and the second direction SD may correspond to the extending direction of bit lines. The first direction FD and the second direction SD may substantially perpendicularly intersect with each other. The third direction TD may correspond to a direction that is perpendicular to the first direction FD and the second direction SD. In the following descriptions, the term 'vertical' or 'vertical direction' will be used as substantially the same meaning as the third direction TD. In the drawings, a direction indicated by an arrow and a direction opposite thereto represent the same direction.

Figure 2:
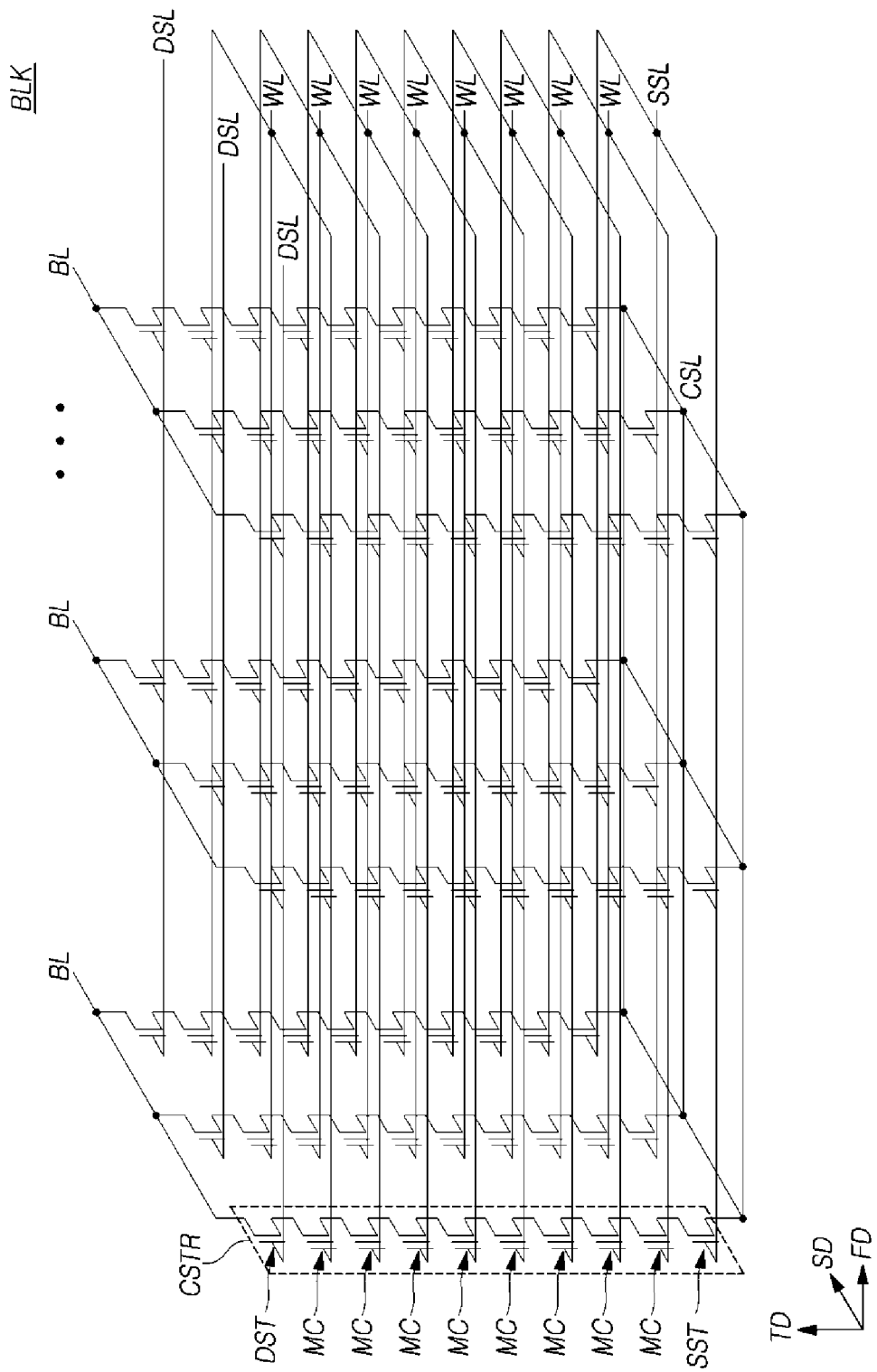
FIG. 2 is an equivalent circuit diagram illustrating an example of a memory block illustrated in FIG. 1 according to an embodiment of the disclosure.

FIG. 2 is an equivalent circuit diagram illustrating an example of a memory block BLK illustrated in FIG. 1 according to an embodiment of the disclosure.

Referring to FIG. 2, the memory block BLK may include a plurality of cell strings CSTR which are coupled between a plurality of bit lines BL and a common source line CSL.

The bit lines BL may extend in the second direction SD, and may be arranged in the first direction FD. A plurality of cell strings CSTR may be coupled in parallel to each of the bit lines BL. The cell strings CSTR may be coupled in common to the one common source line CSL. The plurality of cell strings CSTR may be disposed between the plurality of bit lines BL and the one common source line CSL.

Each of the cell strings CSTR may include a drain select transistor DST which is coupled to a bit line BL, a source select transistor SST which is coupled to the common source line CSL, and a plurality of memory cells MC which are coupled between the drain select transistor DST and the source select transistor SST. The drain select transistor DST, the memory cells MC and the source select transistor SST may be coupled in series in the third direction TD.

Drain select lines DSL, a plurality of word lines WL and a source select line SSL may be disposed between the bit lines BL and the common source line CSL in the third direction TD. The drain select lines DSL may be coupled to the gates of corresponding drain select transistors DST, respectively. The word lines WL may be coupled to the gates of corresponding memory cells MC, respectively. The source select line SSL may be coupled to the gates of source select transistors SST. Memory cells MC which are coupled in common to one word line WL may constitute one page.

Figure 3:
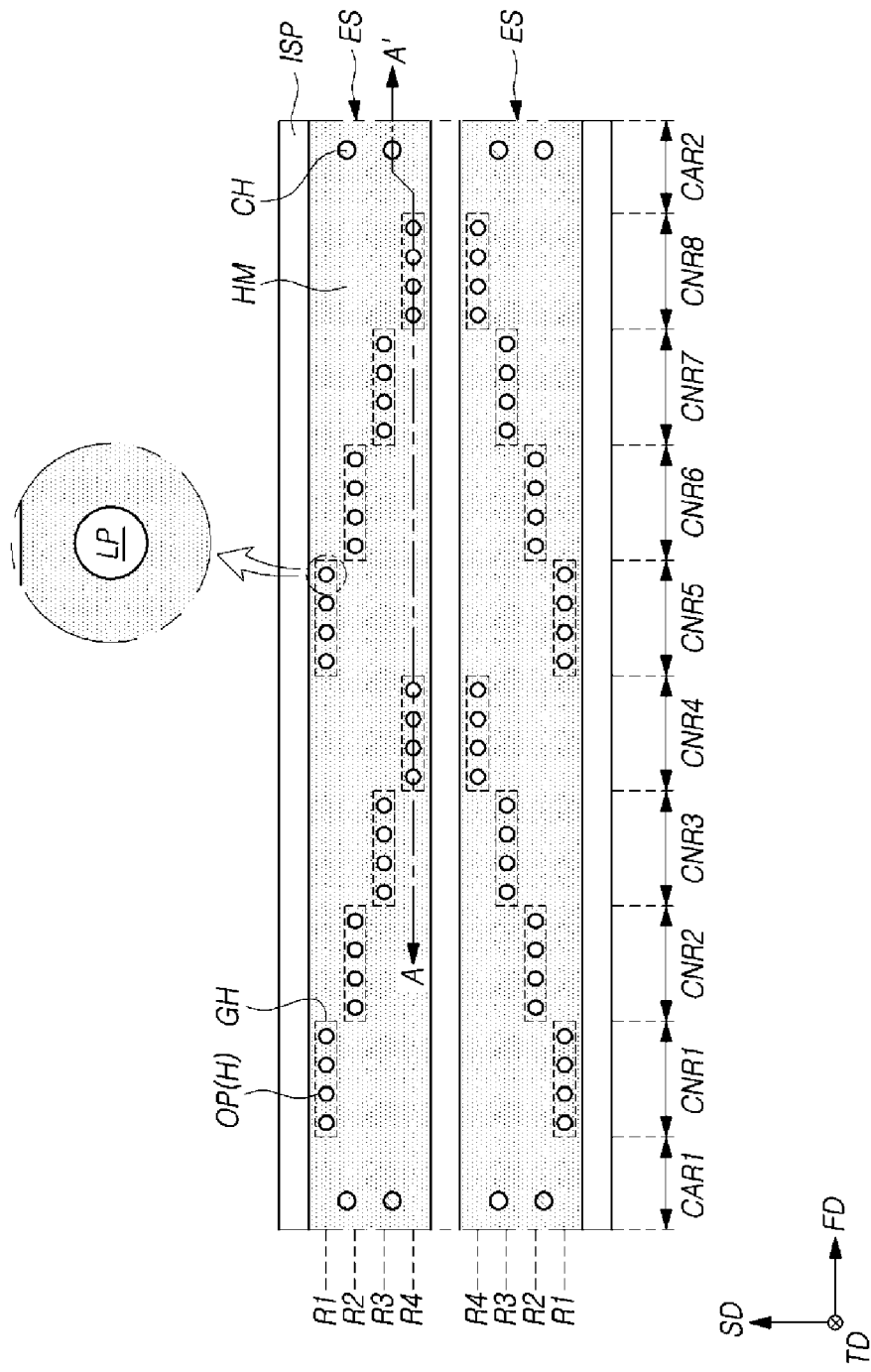
FIG. 3 is a top view illustrating an example of a portion of a semiconductor memory device in accordance with an embodiment of the disclosure.
Figure 4:
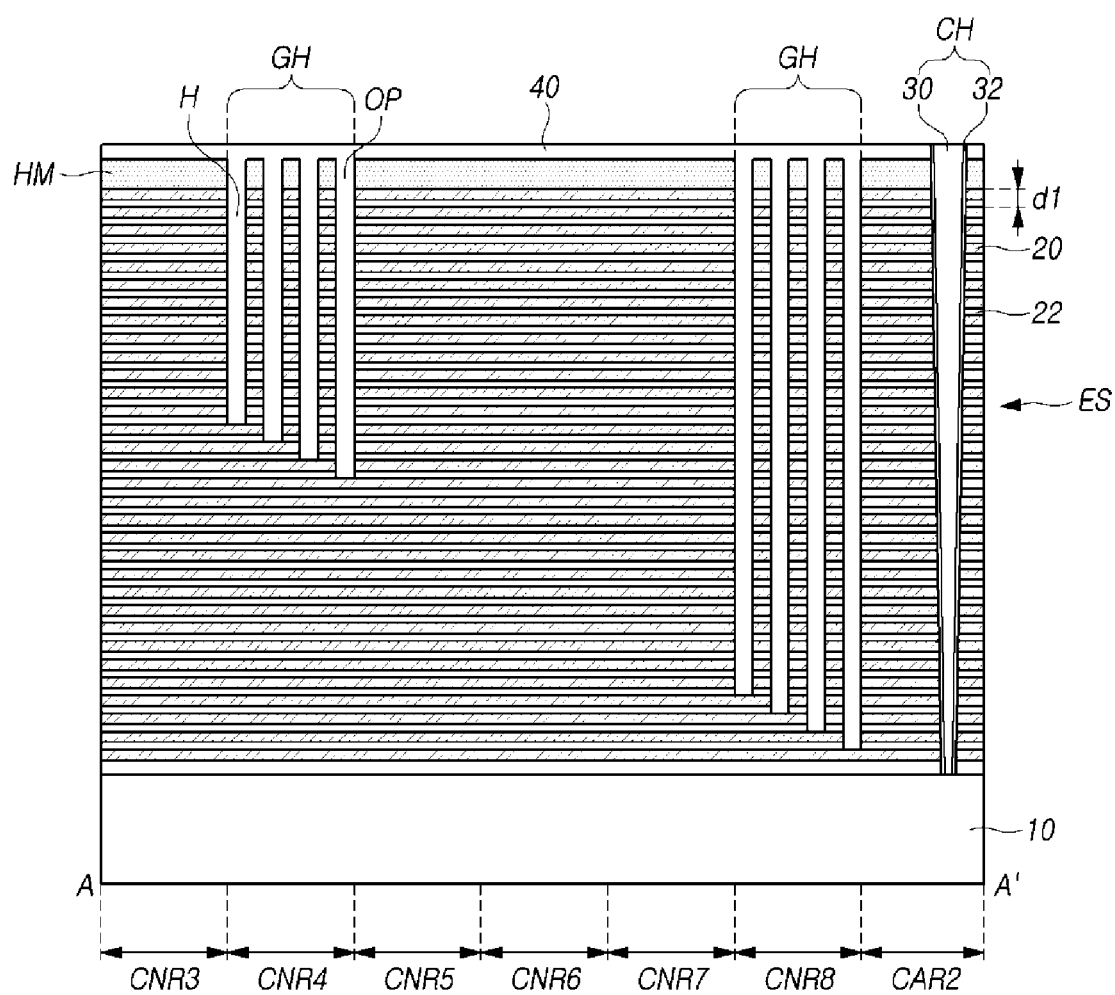
FIG. 4 is a cross-sectional view taken along the line A-A' of FIG. 3 in accordance with an embodiment of the disclosure.

FIG. 3 is a top view illustrating an example of a portion of a semiconductor memory device in accordance with an embodiment of the disclosure. FIG. 4 is a cross-sectional view taken along the line A-A' of FIG. 3.

Referring to FIGS. 3 and 4, a substrate 10 of a semiconductor memory device may include a plurality of cell areas CAR1 and CAR2 and a plurality of coupling areas CNR1 to CNR8. The cell areas CAR1 and CAR2 may include a first cell area CAR1 and a second cell area CAR2 which are disposed apart from each other in the first direction FD. The coupling areas CNR1 to CNR8 may be disposed between the first cell area CAR1 and the second cell area CAR2. The coupling areas CNR1 to CNR8 may include first to eighth coupling areas CNR1 to CNR8 which are disposed in the first direction FD. The first to eighth coupling areas CNR1 to CNR8 may be sequentially disposed in the first direction FD between the first cell area CAR1 and the second cell area CAR2.

For example, the substrate 10 may include at least one among silicon (Si), germanium (Ge), silicon germanium (SiGe), gallium arsenide (GaAs), indium gallium arsenide (InGaAs), aluminum gallium arsenide (AlGaAs) and a compound thereof. The substrate 10 may be a bulk silicon substrate, a silicon-on-insulator (SOI) substrate, a germanium substrate, a germanium-on-insulator (GOI) substrate, a silicon-germanium substrate, or a substrate of an epitaxial thin film obtained by performing selective epitaxial growth (SEG). In another example, the substrate 10 may be formed of a dielectric material, and may include a single film or a plurality of thin films. For example, the substrate 10 may be a silicon oxide layer, a silicon nitride layer, a low-k dielectric layer, or the like.

A plurality of electrode structures ES may be disposed on the substrate 10. Each of the electrode structures ES may include a plurality of electrode layers 20 and a plurality of interlayer dielectric layers 22 which are alternately stacked.

The electrode layers 20 may include a conductive material. For example, the electrode layers 20 may include at least one selected among a doped semiconductor (e.g., doped silicon), a metal (e.g., tungsten, copper or aluminum), conductive metal nitride (e.g., titanium nitride or tantalum nitride) and a transition metal (e.g., titanium or tantalum). The interlayer dielectric layers 22 may include silicon oxide.

The electrode layers 20 may constitute the row lines RL described above with reference to FIG. 1. Among the electrode layers 20, the lowermost may constitute a source select line, and the uppermost may constitute a drain select line. The electrode layers 20 between the source select line and the drain select line may constitute word lines.

Vertical channels CH which pass through the electrode structures ES in the third direction TD may be defined in the first and second cell areas CAR1 and CAR2. The vertical channels CH may be coupled to the substrate 10 through the electrode layers 20 and the interlayer dielectric layers 22. Each of the vertical channels CH may include a channel layer 30 and a gate dielectric layer 32. The channel layer 30 may include polysilicon or monocrystalline silicon, and may include a P-type impurity such as boron (B) in some areas thereof. The channel layer 30 may have the shape of a solid pillar or cylinder whose center region is completely filled. The channel layer 30 may have the shape of a tube whose center region is open. In this case, a buried dielectric layer may be formed in the open center region of the channel layer 30. The gate dielectric layer 32 may have the shape of a straw or a cylindrical shell which surrounds the outer wall of the channel layer 30. While not illustrated, the gate dielectric layer 32 may include a tunnel dielectric layer, a charge storage layer and a blocking layer which are sequentially stacked in an inward direction from the outer wall of the channel layer 30. The tunnel dielectric layer may include silicon oxide, hafnium oxide, aluminum oxide, zirconium oxide or tantalum oxide. The charge storage layer may include silicon nitride, boron nitride, silicon boron nitride or polysilicon doped with an impurity. The blocking layer may include a single layer or a stack layer of silicon oxide, silicon nitride, hafnium oxide, aluminum oxide, zirconium oxide and tantalum oxide. In some embodiments, the gate dielectric layer 32 may have an ONO (oxide-nitride-oxide) stack structure in which an oxide layer, a nitride layer and an oxide layer are sequentially stacked. Source select transistors, memory cells and drain select transistors may be formed in the regions where the electrode layers 20 surround the vertical channels CH.

The electrode structures ES may be separated from each other by line-shaped separation patterns ISP which extend in the first direction FD. Each of the electrode structures ES may be disposed between a pair of adjacent separation patterns ISP. Each separation pattern ISP may be configured by a conductive layer and a sidewall dielectric layer which insulates the conductive layer and the electrode structure ES from each other. The conductive layer may be coupled to the substrate 10. The conductive layer may constitute a common source line (CSL of FIG. 2). Meanwhile, each separation pattern ISP may also be configured by a dielectric layer.

The electrode structures ES may extend in the first direction FD, and may be disposed and spaced apart in the second direction SD. One electrode structure ES and vertical channels CH passing through the same may constitute one memory block (BLK of FIG. 1). Memory cell array 110 illustrated in FIG. 1 may be configured with the electrode structures ES repeatedly disposed in the second direction SD.

Hard mask patterns HM may be disposed on the electrode structures ES. The hard mask patterns HM may be separated from each other by the separation patterns ISP. The vertical channels CH may pass through the hard mask patterns HM.

In the coupling areas CNR1 to CNR8, a plurality of opening holes OP may be defined in each hard mask pattern HM. The opening holes OP may be distributed in a plurality of rows R1 to R4, which aligned with the second direction SD. The opening holes OP may be grouped into a plurality of hole groups GH. On each electrode structure ES, opening holes OP which are disposed in the same coupling area (i.e., for example, CNR1 through CNR8), and in the same row, may be grouped as a hole group GH. Opening holes OP in a hole group GH may be continuously disposed at a constant pitch, or evenly spaced apart, in the first direction FD within the coupling area. The hole groups GH may be distributed in the plurality of rows R1 to R4. The embodiment illustrated in FIGS. 3 and 4 represents a case in which eight hole groups GH are disposed on each electrode structure ES and distributed in the four rows R1 to R4, i.e., two hole groups GH in each row.

On each electrode structure ES, the hole groups GH may be disposed in different coupling areas. On each electrode structure ES, the eight hole groups GH may be disposed in the first to eighth coupling areas CNR1 to CNR8, respectively. While the present embodiment illustrates a case in which one hole group GH is disposed in each coupling area on each electrode structure ES, it is to be noted that the disclosure is not limited thereto. For example, two or more hole groups GH may be disposed in a single coupling area on each electrode structure ES. Such a structure will become more apparent from the following descriptions to be made with reference to FIG. 5.

While the present embodiment illustrates a case in which the hole groups GH are disposed in oblique directions crossing with the first direction FD and the second direction SD, it is to be noted that the disclosure is not limited thereto. The disposition pattern of the hole groups GH may be variously changed.

Contact holes H, which expose the electrode layers 20, may be defined in the electrode structure ES under the opening holes OP. The contact holes H may be formed using the hard mask pattern HM as an etch mask. When viewed from the top, the contact holes H may have the same shape as the opening holes OP of the hard mask pattern HM. Each of the electrode layers 20 may have a pad area LP which is exposed by at least one contact hole H.

Contact holes H under the opening holes OP included in the same hole group GH may have different depths. The contact holes H under the opening holes OP included in the same hole group GH may be sequentially deepened with a difference corresponding to a first depth d1. The first depth d1 may have a size corresponding to the vertical pitch of the electrode layers 20. The vertical pitch of the electrode layers 20 may be defined as the sum of the thickness of one of the electrode layers 20 and one of the interlayer dielectric layers 22. The depths of the contact holes H disposed under the opening holes OP included in different hole groups GH may be different from each other. The depths of the contact holes H in the first to fourth coupling areas CNR1 to CNR4, for example, may increase as a row number R # increases. The depths of the contact holes H in the fifth to eighth coupling areas CNR5 to CNR8 may increase as a row number R # increases. The depths of the contact holes H disposed in the fifth to eighth coupling areas CNR5 to CNR8 may be larger than the depths of the contact holes H disposed in the first to fourth coupling areas CNR1 to CNR4.

Figure 5:
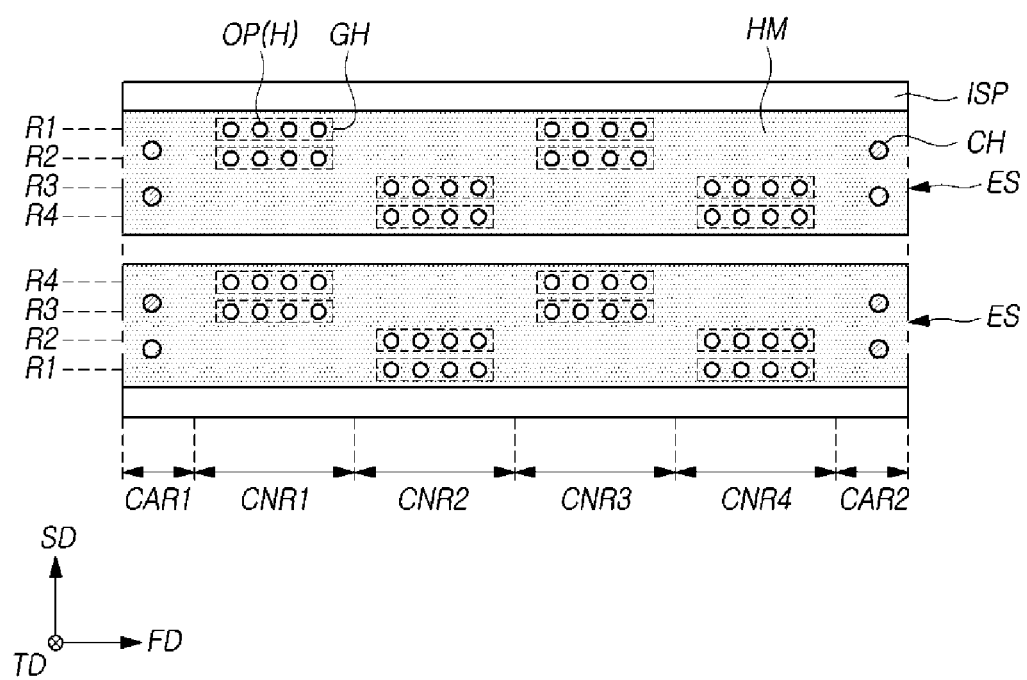
FIGS. 5 and 6 are top views illustrating examples of semiconductor memory devices in accordance with embodiments of the disclosure.
Figure 6:
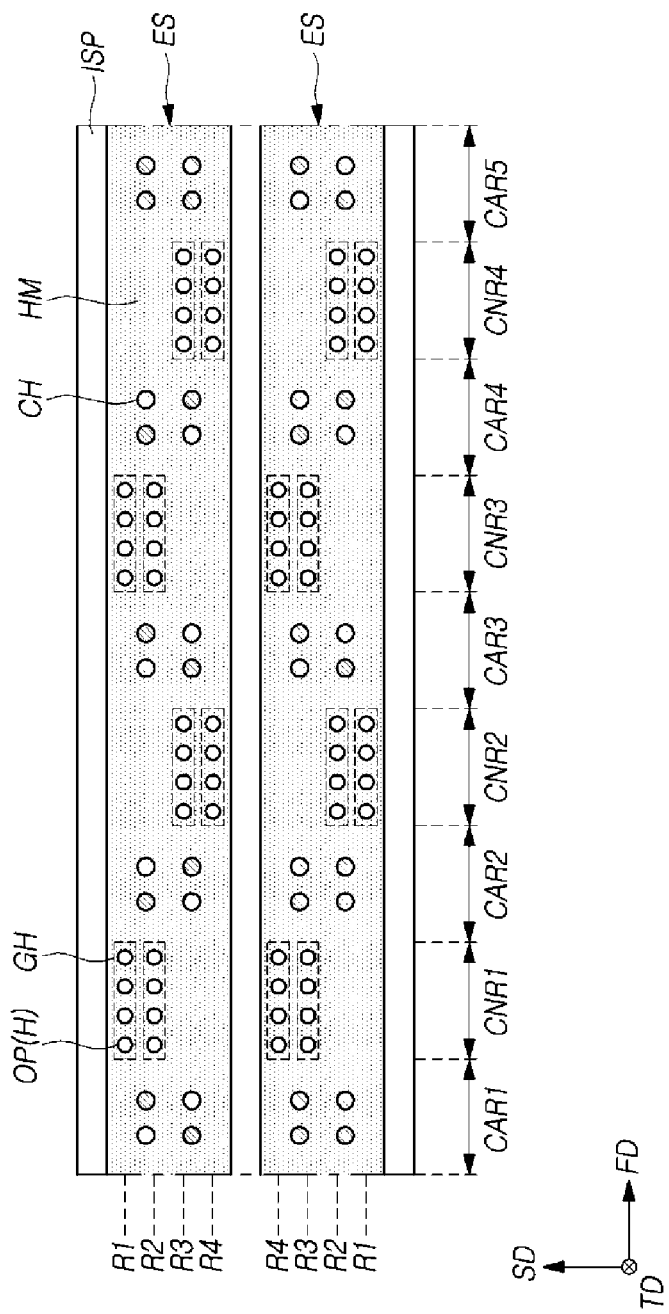

FIGS. 5 and 6 are top views illustrating examples of semiconductor memory devices in accordance with embodiments of the disclosure.

Referring to FIG. 5, in each of coupling areas CNR1 to CNR4, two hole groups GH may be disposed on one electrode structure ES. For example, in the first coupling area CNR1, a hole group GH in a first row R1 and a hole group GH in a second row R2 may be disposed on the electrode structure ES. In the second coupling area CNR2, a hole group GH of a third row R3 and a hole group GH of a fourth row R4 may be disposed on the electrode structure ES.

While the embodiment described with reference to FIG. 5 illustrates a case in which two hole groups GH are disposed in each of the coupling areas CNR1 to CNR4 on the electrode structure ES, it is to be noted that the technical spirit of the disclosure is not limited thereto. The disclosure may include all cases in which two or more hole groups GH are disposed in at least one of the coupling areas CNR1 to CNR4 on the electrode structure ES.

As described above with reference to FIG. 3, the contact holes H may define the pad areas LP of the electrode layers 20. When viewed from the top, the contact holes H may have the same shape as the opening holes OP of the hard mask pattern HM, and the opening holes OP of the hard mask pattern HM may be grouped into a plurality of hole groups GH. Therefore, in order to reduce an area required to define the pad areas LP, the area of a region where the hole groups GH are disposed needs to be reduced. According to embodiments of the present disclosure, two or more hole groups GH are disposed in each of the coupling areas CNR1 to CNR4. Due to this fact, since the number of coupling areas required for the disposition of the hole groups GH is reduced, the length of the semiconductor memory device in the first direction FD may be reduced, and furthermore, the size of the semiconductor memory device may be reduced.

Referring to FIG. 6, a plurality of cell areas CAR1 to CAR5 and a plurality of coupling areas CNR1 to CNR4 may be alternately disposed in the first direction FD. The cell areas CAR1 to CAR5 may include first to fifth cell areas CAR1 to CAR5, and the coupling areas CNR1 to CNR4 may include first to fourth coupling areas CNR1 to CNR4.

While not illustrated, contact plugs may be formed in contact holes H, and thereby, may be coupled to electrode layers (20 of FIG. 4). The contact plugs may be coupled to pass transistors through wiring lines, and accordingly, electrical paths which couple the electrode layers and the pass transistors may be configured. The electrode layers may be provided with operating voltages from the pass transistors through the electrical paths which are formed by the contact plugs and the wiring lines.

In a PUC (peri under cell) structure, the pass transistors may be disposed below the substrate 10 and the electrode structure ES. Meanwhile, in a POC (peri over cell) structure, the pass transistors may be disposed over the substrate 10 and the electrode structure ES. The operating voltages transferred through the pass transistors may be relatively high voltages. In order to transfer the high voltages, the pass transistors may be fabricated to at least a predetermined size to have high breakdown voltage characteristics. Due to the size of the pass transistors, it may be impossible to dispose all pass transistors in coupling areas, and pass transistors may also be disposed in cell areas.

With an increase in the degree of integration of a semiconductor memory device, as the number of the electrode layers 20 and the number of the pass transistors for transferring the operating voltages to the electrode layers 20 increase, the pass transistors may also be disposed in cell areas that are further removed from the coupling areas.

If pass transistors are disposed in coupling areas or are disposed adjacent to the coupling areas, then wiring lines which couple the pass transistors and the electrode layers 20 may have shorter lengths. On the other hand, if pass transistors are disposed away from the coupling areas, then wiring lines which couple the pass transistors and the electrode layers 20 may have longer lengths. Such differences in the lengths of wiring lines may cause deviations in terms of operating voltage transfer speed, and thereby, the operating characteristics of the semiconductor memory device may be degraded. Further, it is not easy to design and fabricate wiring lines having long lengths by avoiding other wiring lines.

Referring to FIG. 6, the coupling areas CNR1 to CNR4 are not continuous, but instead disposed between the cell areas CAR1 to CAR5. Therefore, pass transistors which are coupled to the electrode layers 20 through contacts positioned in a specific coupling area may be disposed in the corresponding coupling area and cell areas adjacent thereto. The lengths of the wiring lines which couple the pass transistors and the electrode layers 20 may be shortened, and deviations in the lengths of the wiring lines may be reduced. Because deviations in operating voltage transfer speeds depend on the differences in the lengths of the wiring lines, shorter wiring lines make it possible to improve the operating characteristics of a semiconductor memory device disclosed herein and to facilitate the design and fabrication of the wiring lines.

Figure 7:
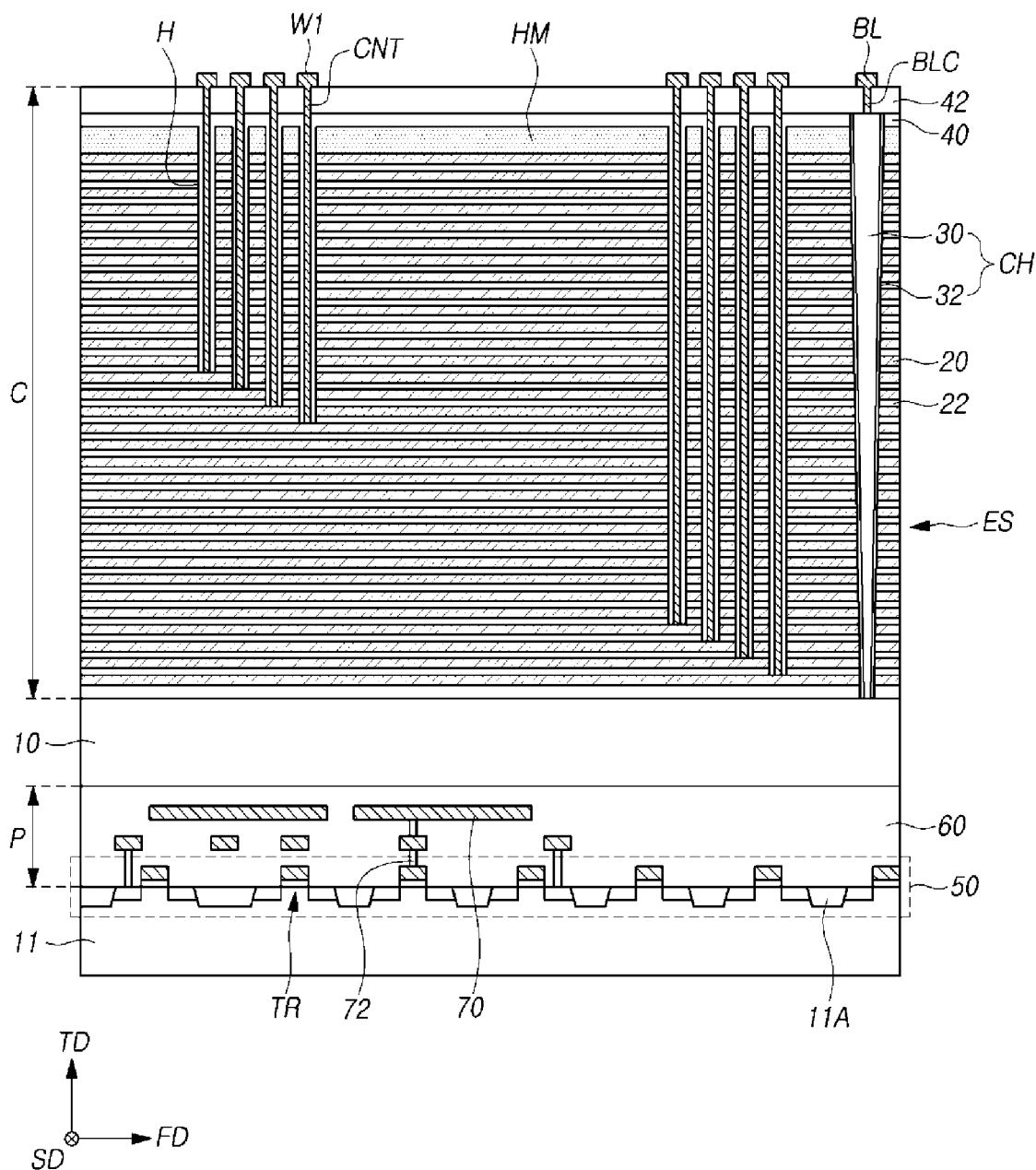
FIGS. 7 and 8 are cross-sectional views illustrating examples of semiconductor memory devices in accordance with embodiments of the disclosure.
Figure 8:
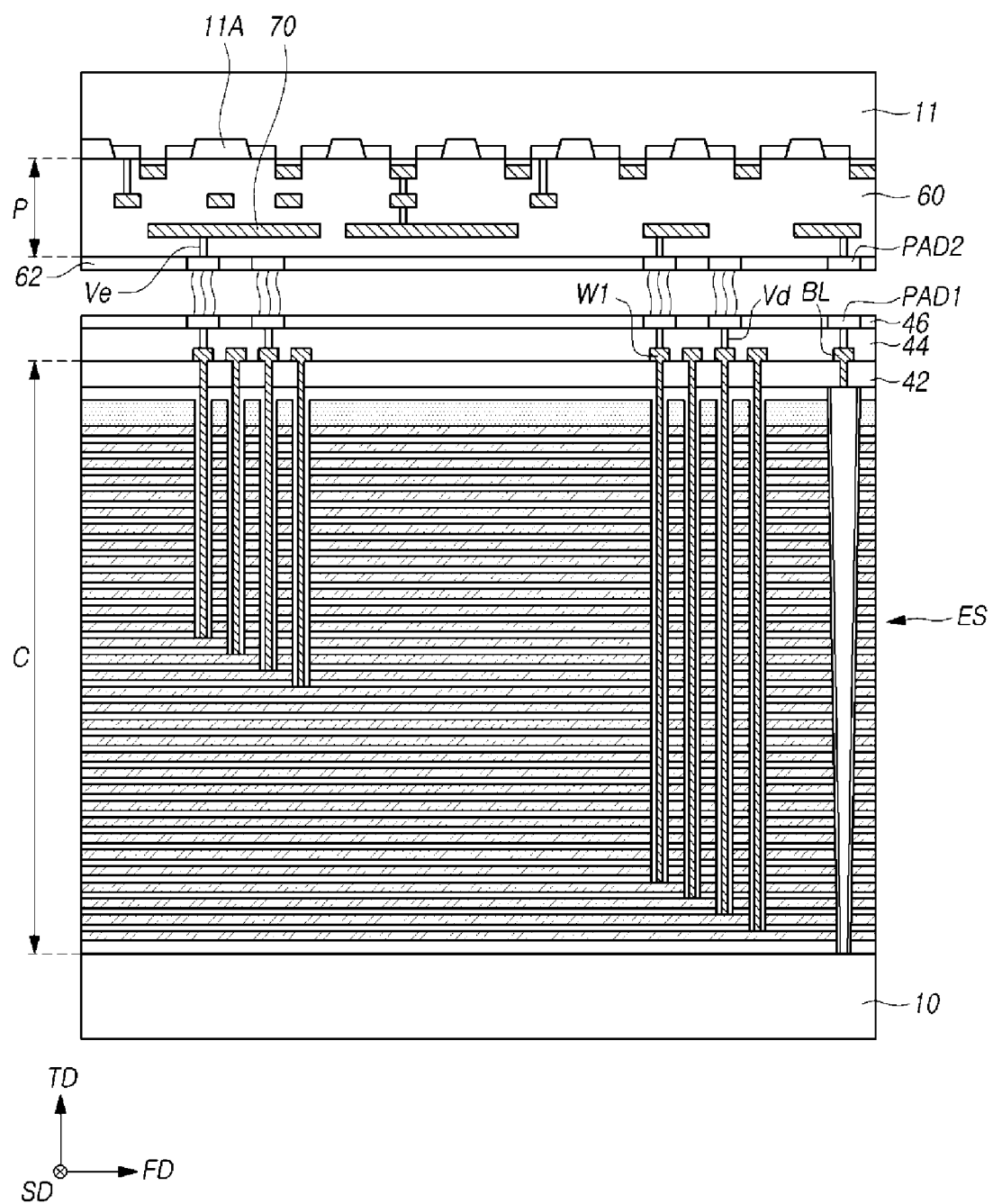

FIGS. 7 and 8 are cross-sectional views illustrating examples of semiconductor memory devices in accordance with embodiments of the disclosure.

Referring to FIG. 7, the semiconductor memory device may have a PUC (peri under cell) structure. A logic structure P may be disposed under a memory structure C.

The memory structure C may be disposed on a first substrate 10. The logic structure P may be disposed on a second substrate 11. The second substrate 11 may include at least one selected from the group including a monocrystalline silicon layer, an SOI (silicon on insulator), a silicon layer formed on a silicon germanium (SiGe) layer, a monocrystalline silicon layer formed on a dielectric layer and a polysilicon layer formed on a dielectric layer. The first substrate 10 may be formed as a polysilicon layer. Since the first substrate 10 needs to be formed on the logic structure P unlike the second substrate 11, which may use a monocrystalline silicon layer, the first substrate 10 may be formed as a polysilicon layer.

As described above with reference to FIGS. 3 to 6, the memory structure C may include an electrode structure ES which is disposed on the first substrate 10, vertical channels CH which pass through the electrode structure ES, and a hard mask pattern HM. The opening holes OP described above with reference to FIGS. 3 to 6 may be defined in the hard mask pattern HM. The contact holes H described above with reference to FIGS. 3 to 6 may be defined in the electrode structure ES.

A dielectric layer 40 may be disposed on the first substrate 10, and thereby, may cover the top surfaces and side surfaces of the electrode structure ES and the hard mask pattern HM, as well as the side surfaces of the vertical channels CH. A dielectric layer 42 may be disposed on the dielectric layer 40, and thereby, may cover the top surfaces of the vertical channels CH. The dielectric layers 40 and 42 may include silicon oxide, for example, HDP (high density plasma) oxide or TEOS (tetra-ethyl-ortho-silicate) oxide.

A bit line BL may be disposed on the dielectric layer 42. The bit line BL may extend in the second direction SD, and may be provided in a plural number, spaced apart in the first direction FD. A bit line contact BLC, which passes through the dielectric layer 42, may be disposed under the bit line BL, and couple the bit line BL and a channel layer 30 of a vertical channel CH.

A plurality of wiring lines W1 may be disposed on the dielectric layer 42. Contacts CNT which pass through the dielectric layers 42 and 40 may be disposed under the wiring lines W1. The contacts CNT may be coupled to the pad areas of electrode layers 20 which are exposed by contact holes H, respectively.

The logic structure P may include a logic circuit 50, a dielectric layer 60, and wiring lines 70. The logic circuit 50 may include transistors TR, which are disposed on active regions of the second substrate 11 defined by an isolation layer 11A. While not illustrated, the logic circuit 50 may further include capacitors, inductors, and so forth. The logic circuit 50 may constitute the row decoder 121, the page buffer circuit 122 and the peripheral circuit 123 of FIG. 1.

The dielectric layer 60 may be disposed on the second substrate 11, and thereby, may cover the logic circuit 50. The dielectric layer 60 may include silicon oxide, for example, HDP oxide or TEOS oxide.

The wiring lines 70 may be disposed in the dielectric layer 60. The wiring lines 70 may be disposed at a plurality of wiring layers which are at vertically different positions in the third direction TD. Contacts 72, dispose in dielectric layer 60, may be formed, and thereby, may couple the logic circuit 50 with the wiring lines 70, as well as couple wiring lines 70 that are in different wiring layers.

Referring to FIG. 8, the semiconductor memory device may have a POC (peri over cell) structure. In other words, a logic structure P may be disposed over a memory structure C.

The memory structure C and the logic structure P may be fabricated on different substrates and then bonded with each other. The memory structure C may be fabricated on a first substrate 10. The logic structure P may be fabricated on a second substrate 11. The first substrate 10 and the second substrate 11 may be formed of the same material. The first substrate 10 and the second substrate 11 may each include at least one selected from the group including a monocrystalline silicon layer, an SOI (silicon on insulator), a silicon layer formed on a silicon germanium (SiGe) layer, a monocrystalline silicon layer formed on a dielectric layer and a polysilicon layer formed on a dielectric layer.

A dielectric layer 44 may be defined on a dielectric layer 42, and thereby, may cover bit lines BL and wiring lines W1. First pads PAD1, which are coupled to the bit lines BL and the wiring lines W1 through vertical vias Vd, may be defined on or in the dielectric layer 44. A dielectric layer 46 may be defined on the dielectric layer 44, and thereby, may cover the side surfaces of the first pads PAD1, while the top surfaces of the first pads PAD1 are exposed. The dielectric layer 46 and the first pads PAD1 may be configured on a surface of the memory structure C.

Second pads PAD2 may be defined on or in a dielectric layer 60 of the logic structure P. The second pads PAD2 may correspond to the first pads PAD1, respectively, of the memory structure C. The second pads PAD2 may be coupled to wiring lines 70 through vertical vias Ve. A dielectric layer 62 may be defined or disposed on the dielectric layer 60, and thereby, may cover the side surfaces of the second pads PAD2 while leaving exposed the top surfaces of the second pads PAD2. The dielectric layer 62 and the second pads PAD2 may be configured on a surface of the logic structure P.

The surface of the logic structure P may be bonded onto the surface of the memory structure C such that the first pads PAD1 and the second pads PAD2 are coupled with each other. Accordingly, electrical paths may be configured that couple the memory structure C and the logic structure P.

FIGS. 9A to 18A are top views illustrating examples of processing steps of a method for manufacturing a semiconductor memory device in accordance with an embodiment of the disclosure. FIGS. 9B to 18B are cross-sectional views taken along the lines B-B' of FIGS. 9A to 18A. FIGS. 14C to 16C are cross-sectional views taken along the lines C-C' of FIGS. 14A to 16A.

Figure 9A:
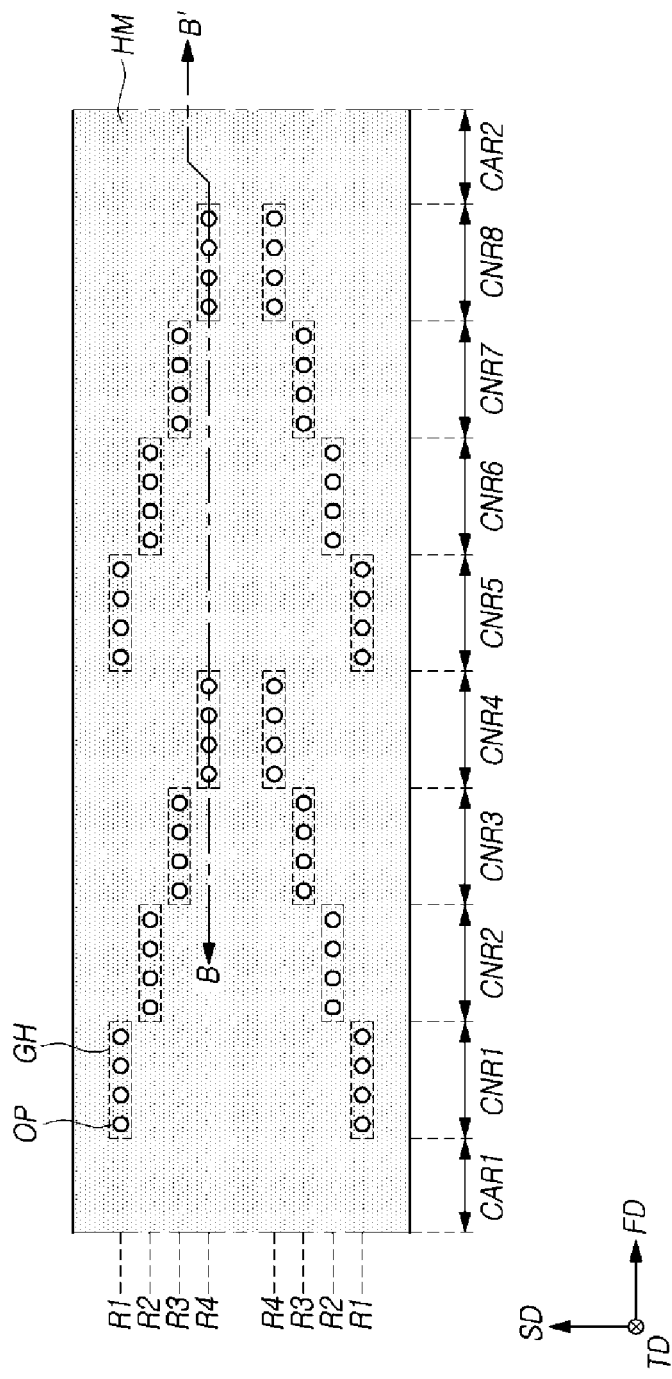
Figure 9B:
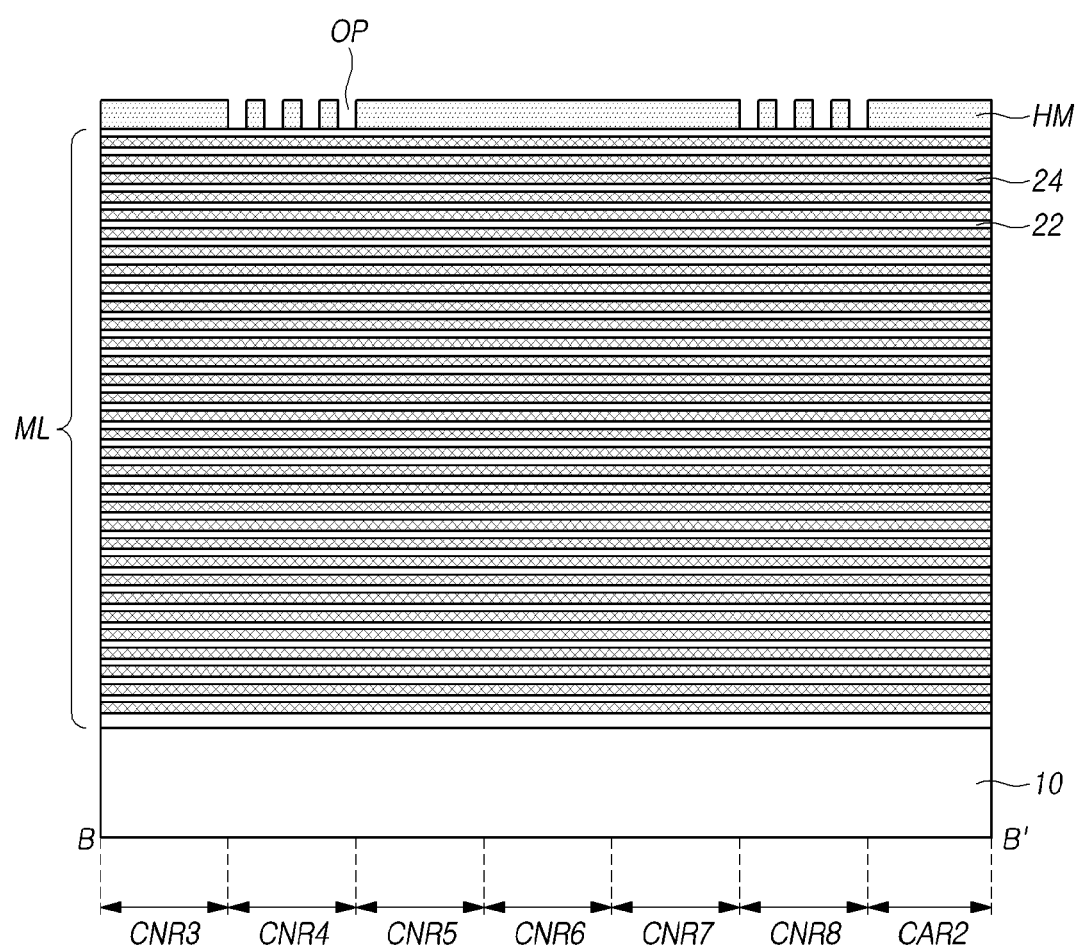

Referring to FIGS. 9A and 9B, a stack ML may be formed with first material layers 22 and second material layers 24 alternately stacked on a substrate 10, which includes a plurality of cell areas CAR1 and CAR2 and a plurality of coupling areas CNR1 to CNR8 that are disposed in the first direction FD.

The first material layers 22 and the second material layers 24 may be formed of different materials. For example, the first material layers 22 may be formed of a dielectric material for interlayer dielectric layers, and the second material layers 24 may be formed of a sacrificial dielectric material that has an etching selectivity with respect to the first material layers 22. For example, the first material layers 22 may be formed of silicon oxide. The second material layers 24 may be formed of silicon nitride.

A hard mask pattern HM having a plurality of opening holes OP may be formed on the stack ML. The hard mask pattern HM may be formed of a material which has an etching selectivity with respect to the first and second material layers 22 and 24. For example, the hard mask pattern HM may be formed of a metal.

The opening holes OP may be distributed in a plurality of rows R1 to R4, which are arranged in the second direction SD. Opening holes OP that are disposed in the same coupling area and in the same row may be grouped as a hole group GH. The opening holes OP in a hole group GH may be continuously disposed at a constant pitch, or evenly spaced apart, in the first direction FD within the coupling area.

The hard mask pattern HM may include a plurality of hole groups GH. The hole groups GH may be distributed in the plurality of rows R1 to R4, which are arranged in the second direction SD. FIGS. 9A to 18A illustrate regions in which two electrode structures are formed to include four rows R1 to R4. The present embodiment illustrates a case where eight hole groups GH are disposed in the four rows R1 to R4, with two hole groups GH in each row in each electrode structure forming region.

Figure 10A:
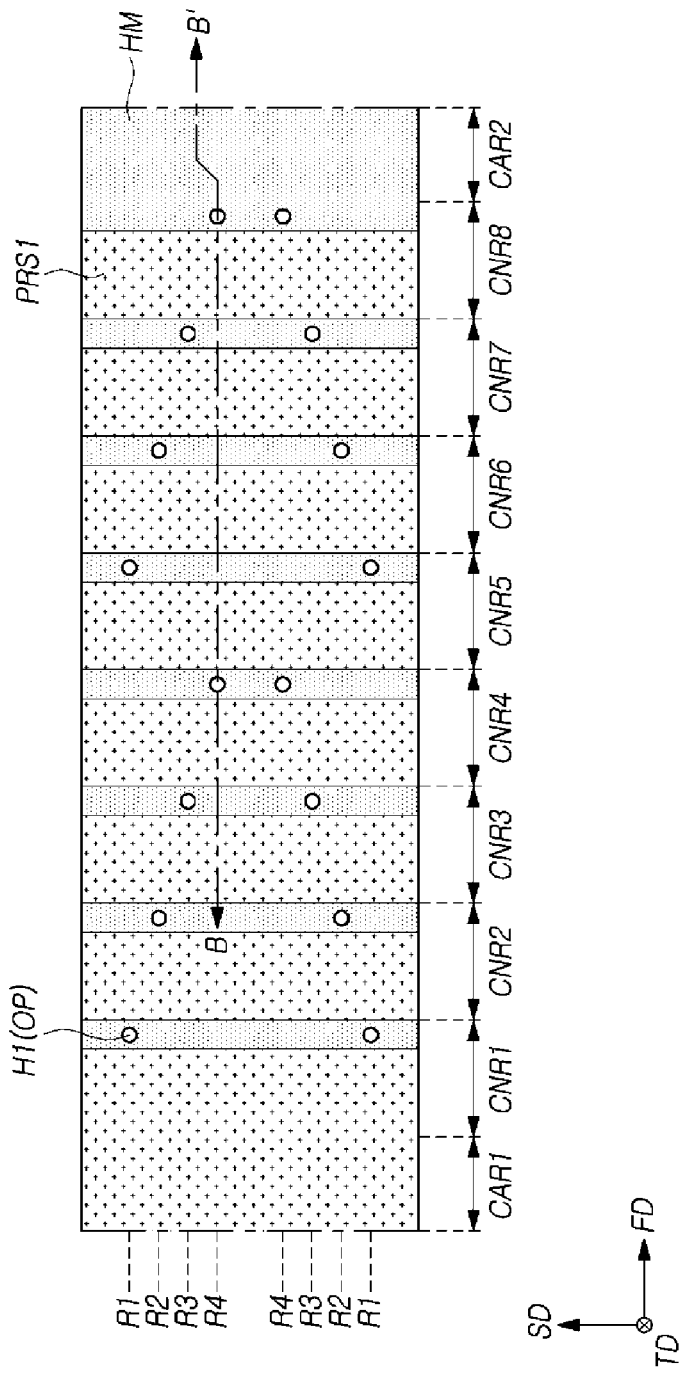
Figure 10B:
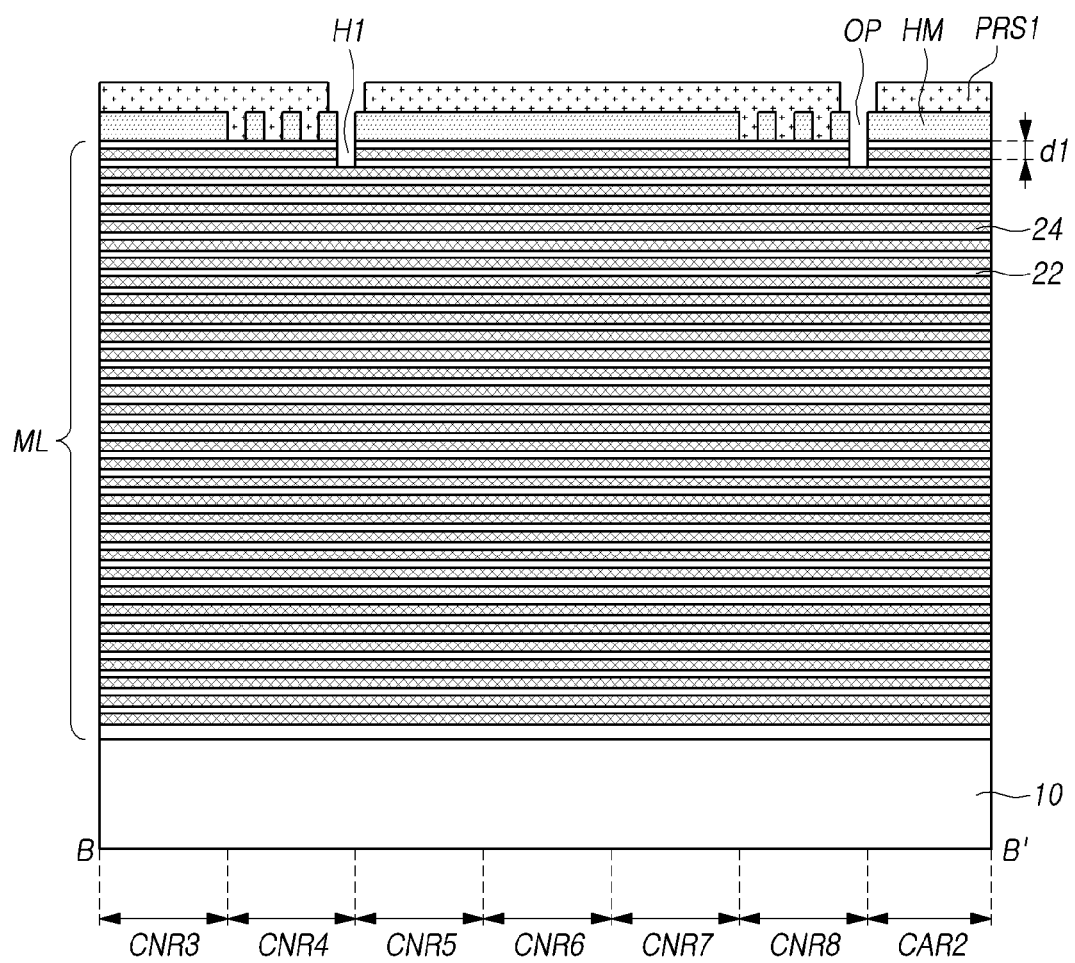

Referring to FIGS. 10A and 10B, a mask pattern PRS1 may be formed on the hard mask pattern HM. The mask pattern PRS1 may expose one of the opening holes OP in each of the hole groups GH.

A first unit etching process for etching the stack ML by using the mask pattern PRS1 and the hard mask pattern HM as an etch mask may be performed. The etch depth of the first unit etching process may be a first depth d1, and the first depth d1 may be the same as the vertical pitch of the second material layers 24. The vertical pitch of the second material layers 24 may be defined as the sum of the thickness of one of the second material layers 24 and one of the first material layers 22.

First contact holes H1 may be formed in the stack ML in the first unit etching process. The mask pattern PRS1 may be formed using a photolithography process, and may be removed after the first unit etching process.

Figure 11A:
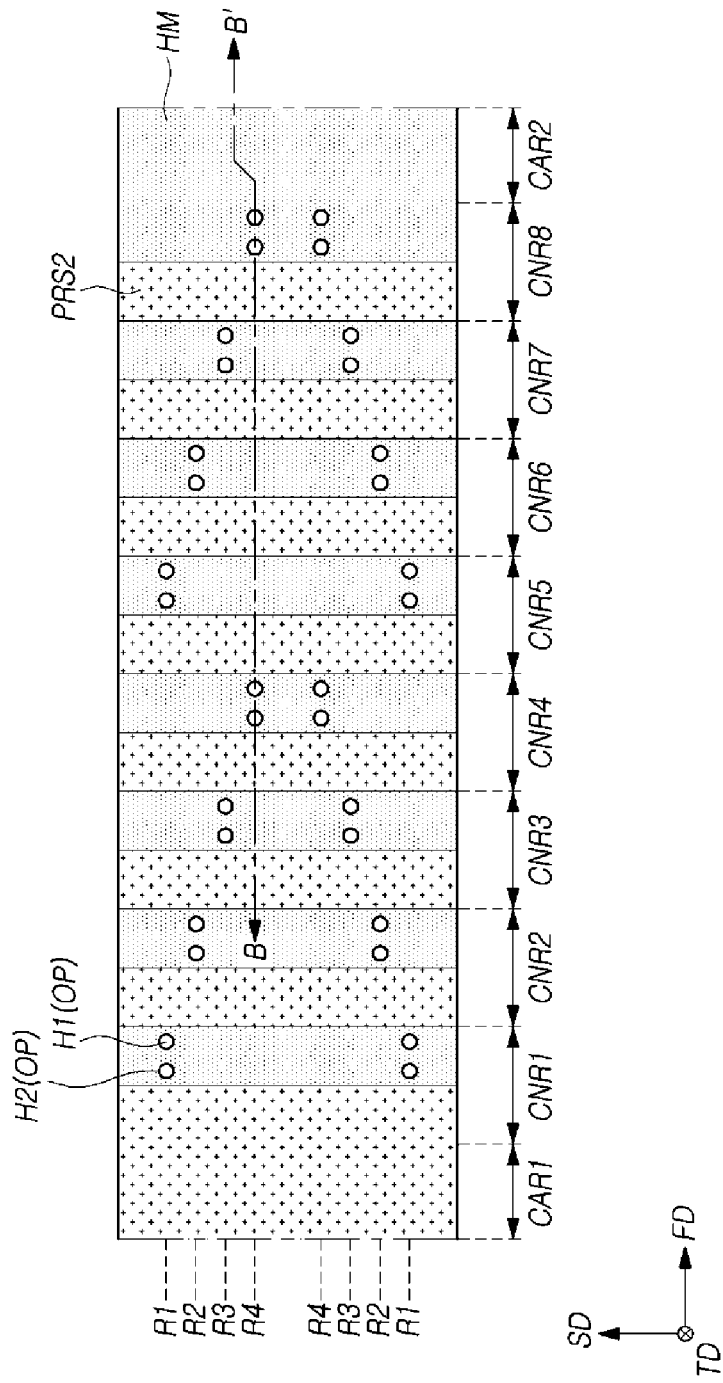
Figure 11B:
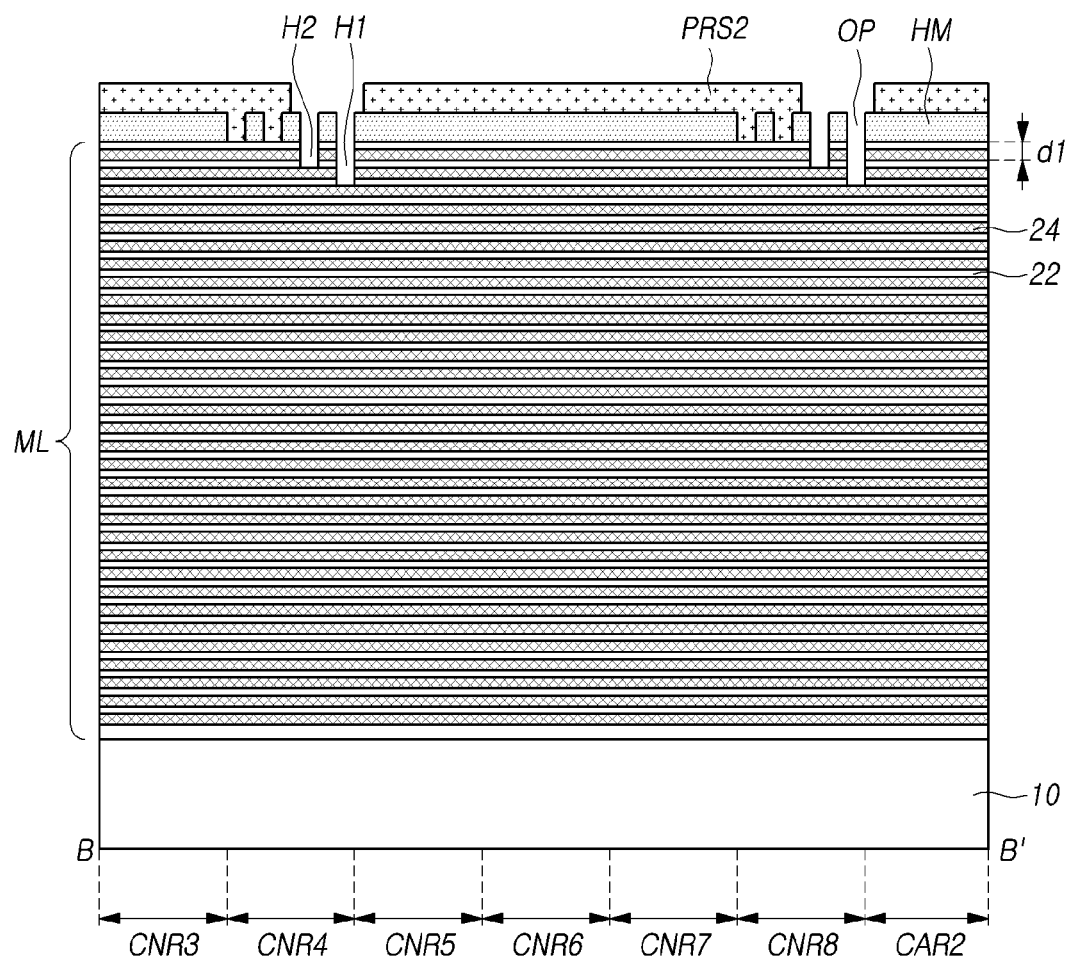

Referring to FIGS. 11A and 11B, a mask pattern PRS2 may be formed on the hard mask pattern HM. The mask pattern PRS2 may expose two of the opening holes OP in each of the hole groups GH. For example, in each of the hole groups GH, an opening hole OP that overlaps with a first contact hole H1, and an opening hole OP adjacent thereto, may be exposed.

A second unit etching process for etching the stack ML using the mask pattern PRS2 and the hard mask pattern HM as an etch mask may be performed. The etch depth of the second unit etching process may be the first depth d1. In the second unit etching process, second contact holes H2 may be formed in the stack ML to a first depth d1, and the depth of the first contact holes H1 may be deepened. The mask pattern PRS2 may be formed using a photolithography process, and may be removed after the second unit etching process.

Figure 12A:
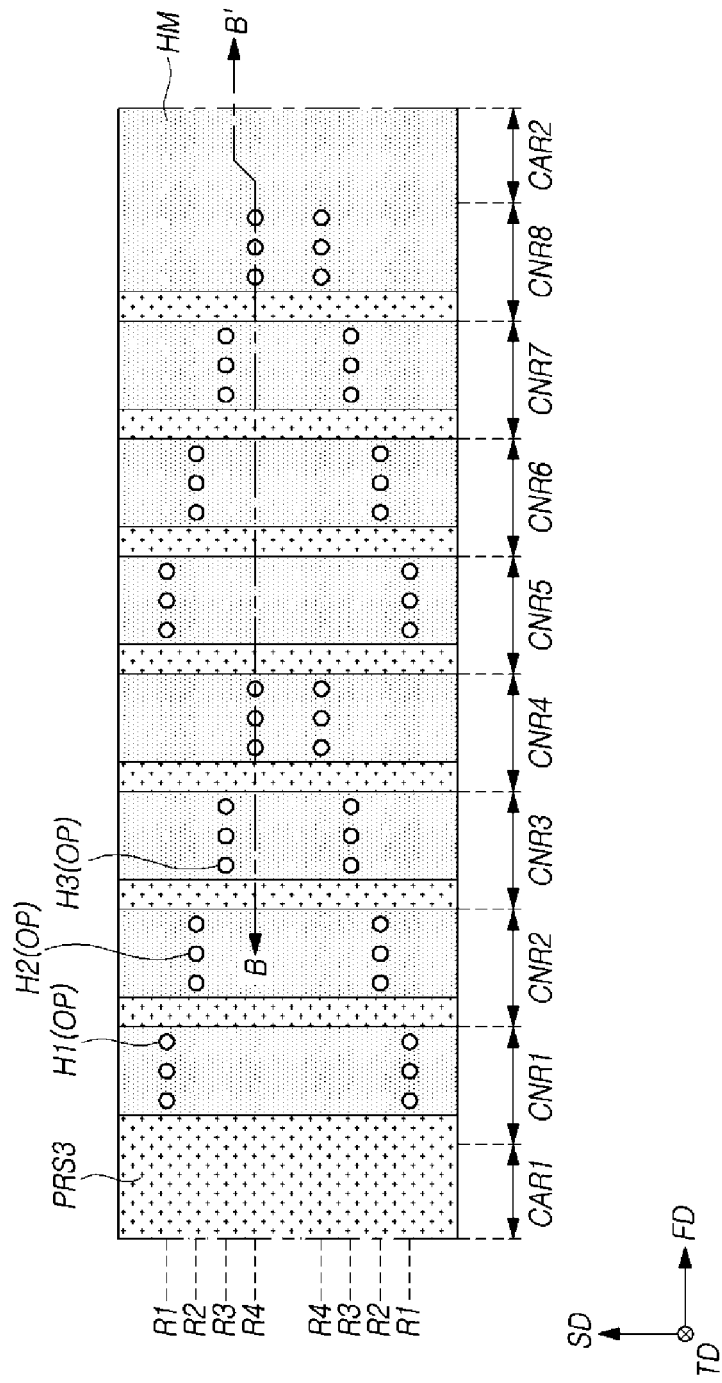
Figure 12B:
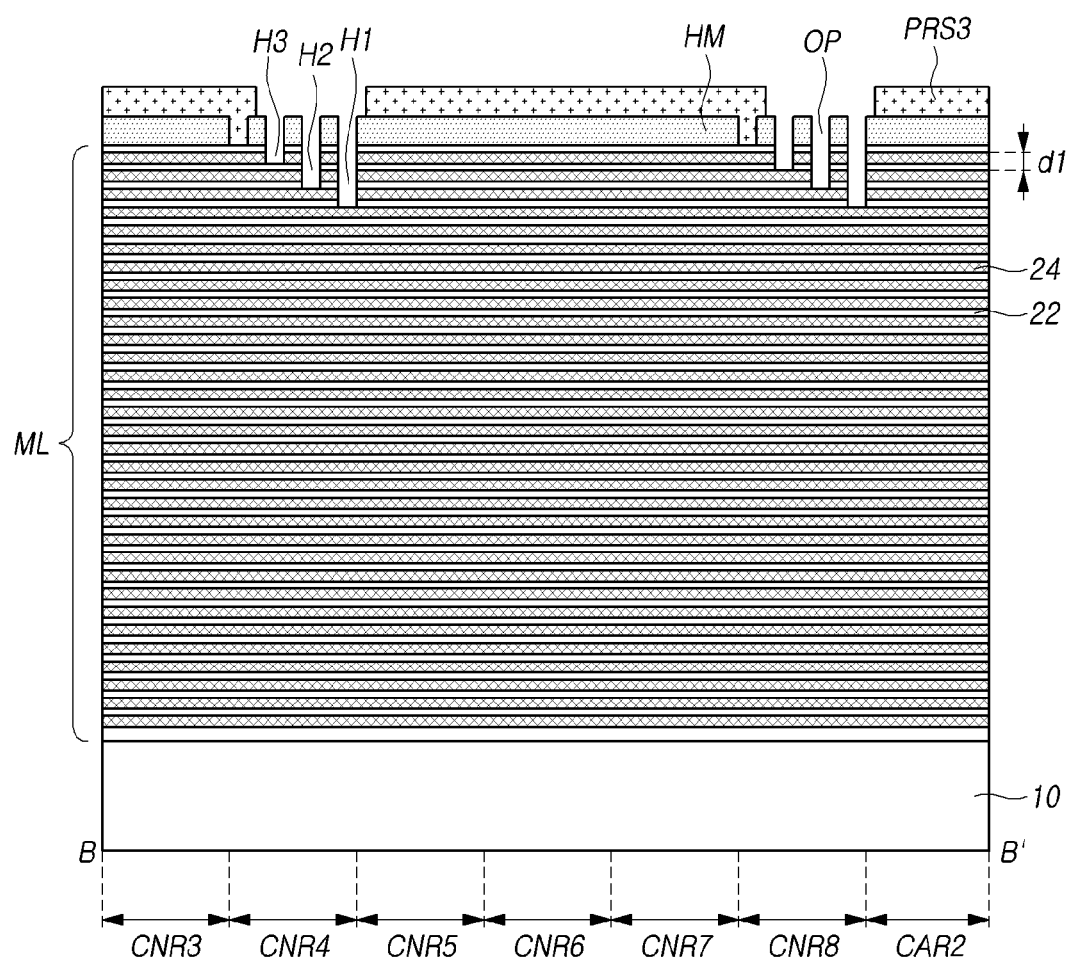

Referring to FIGS. 12A and 12B, a mask pattern PRS3 may be formed on the hard mask pattern HM. The mask pattern PRS3 may expose three of the opening holes OP in each of the hole groups GH. For example, opening holes OP that overlap with the first and second contact holes H1 and H2, and an opening hole OP adjacent thereto, may be exposed.

A third unit etching process for etching the stack ML by using the mask pattern PRS3 and the hard mask pattern HM as an etch mask may be performed. The etch depth of the third unit etching process may be a first depth d1. In the third unit etching process, third contact holes H3 may be formed in the stack ML to a first depth d1, and the depths of the first contact holes H1 and the second contact holes H2 may be deepened. The mask pattern PRS3 may be formed using a photolithography process, and may be removed after the third unit etching process.

Figure 13A:
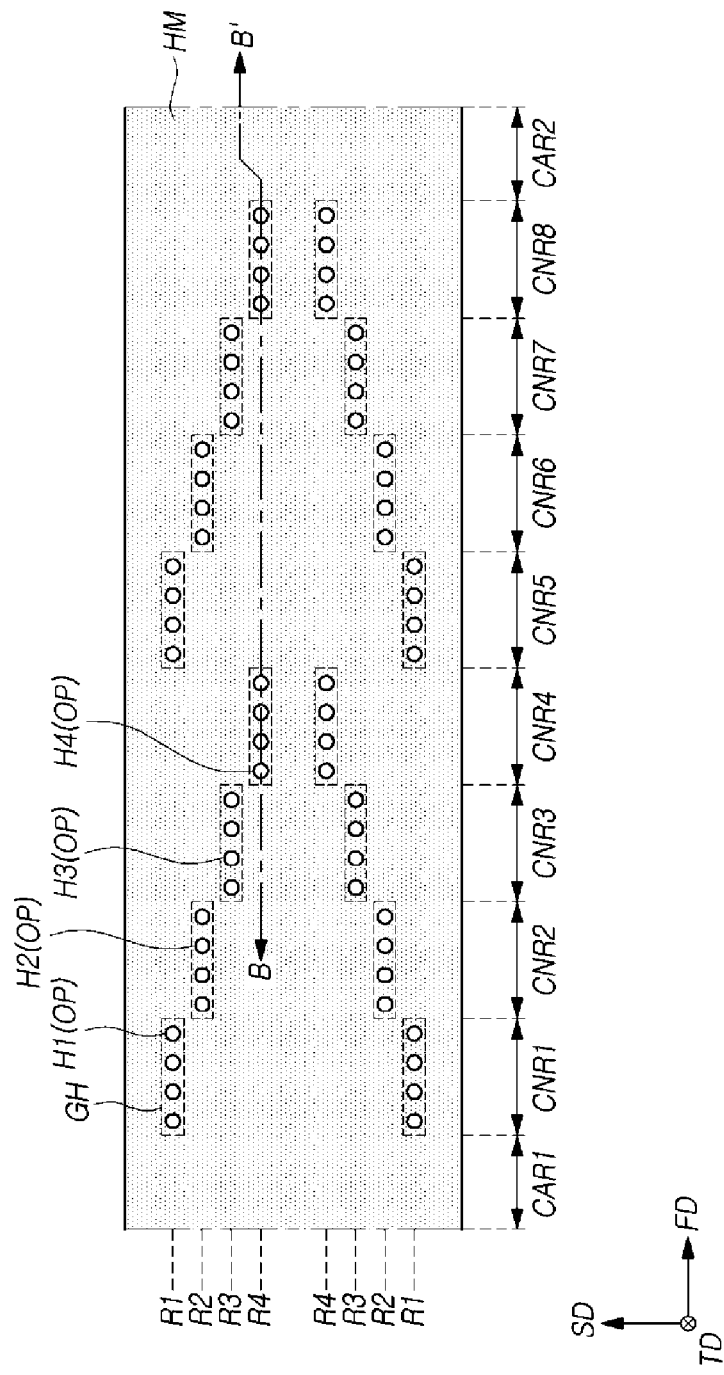
Figure 13B:
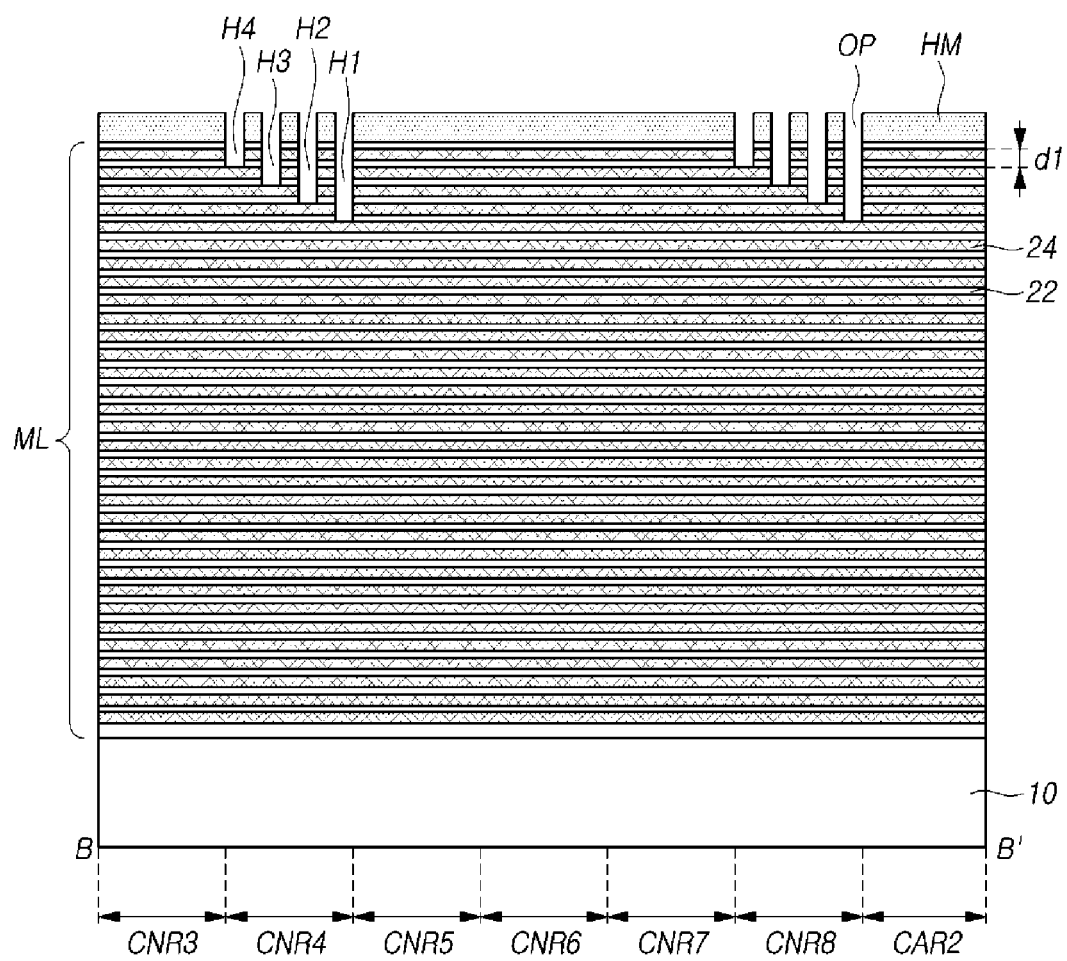

Referring to FIGS. 13A and 13B, a fourth unit etching process for etching the stack ML by using the hard mask pattern HM as an etch mask may be performed. The etch depth of the fourth unit etching process may be the same as the first depth d1. By the fourth unit etching process, fourth contact holes H4 may be formed in the stack ML to a first depth d1, and the depths of the first to third contact holes H1 to H3 may be deepened.

Through the above-described processes, the contact holes H1 to H4 may be defined in the stack ML. Because the contact holes H1 to H4 are formed by the etching processes using the hard mask pattern HM as an etch mask, when viewed from the top, the contact holes H1 to H4 may have substantially the same shape as the opening holes OP of the hard mask pattern HM.

Figure 14A:
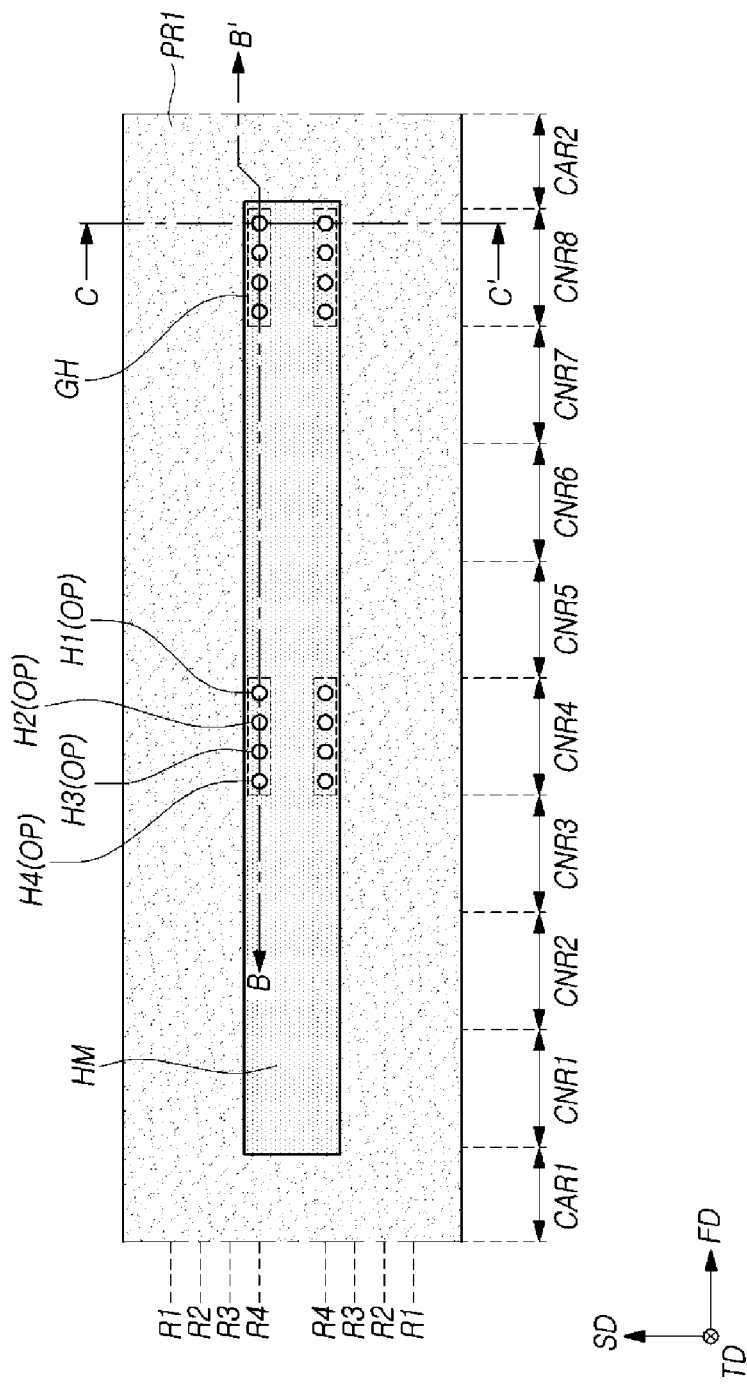
Figure 14B:
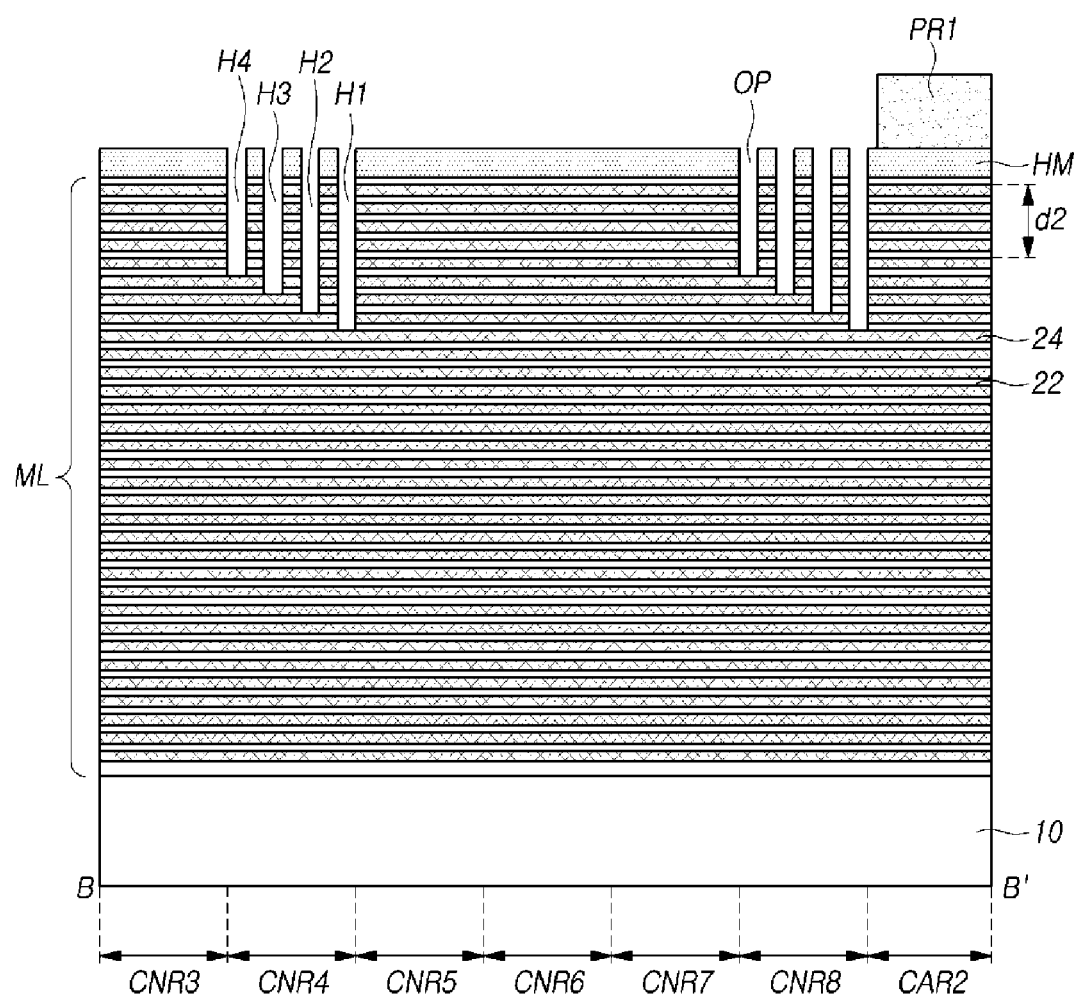
Figure 14C:
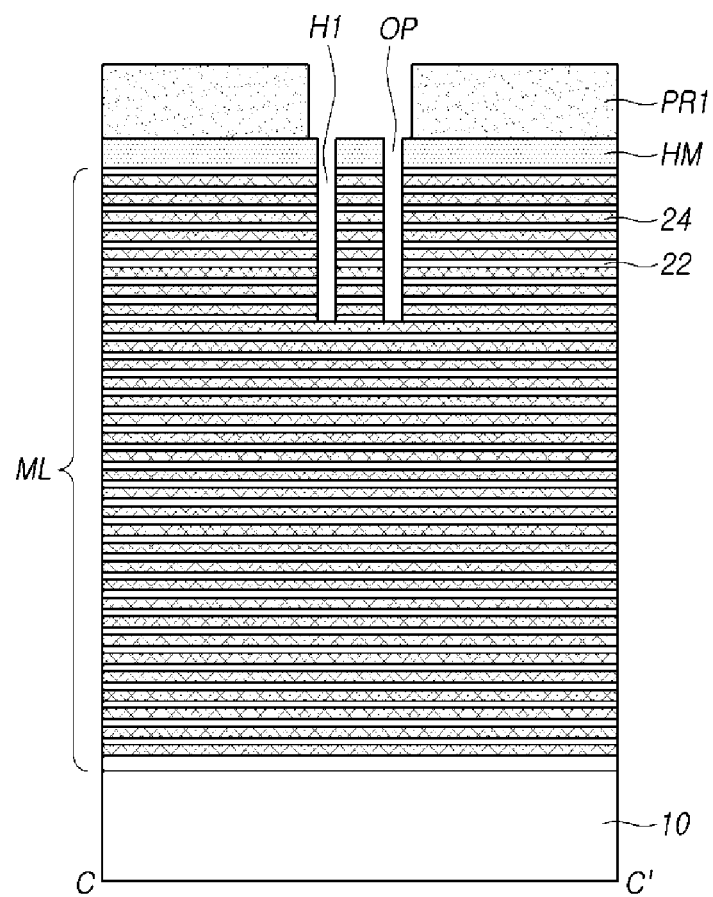

Referring to FIGS. 14A to 14C, a mask pattern PR1 which has an opening exposing the fourth row R4 may be formed on the stack ML. The mask pattern PR1 may expose the hole groups GH disposed in the fourth row R4.

A recess etching process for etching the stack ML using the mask pattern PR1 and the hard mask pattern HM as an etch mask may be performed. The etch depth of the recess etching process may be a second depth d2. The second depth d2 may be larger than the first depth d1. The second depth d2 may be K (where K is a natural number of 2 or greater) times the vertical pitch d1. In an example, the second depth d2 corresponds to four times the first depth d1. In the recess etching process, the depths of the contact holes H1 to H4 disposed in the fourth row R4 may be deepened by the second depth d2.

Figure 15A:
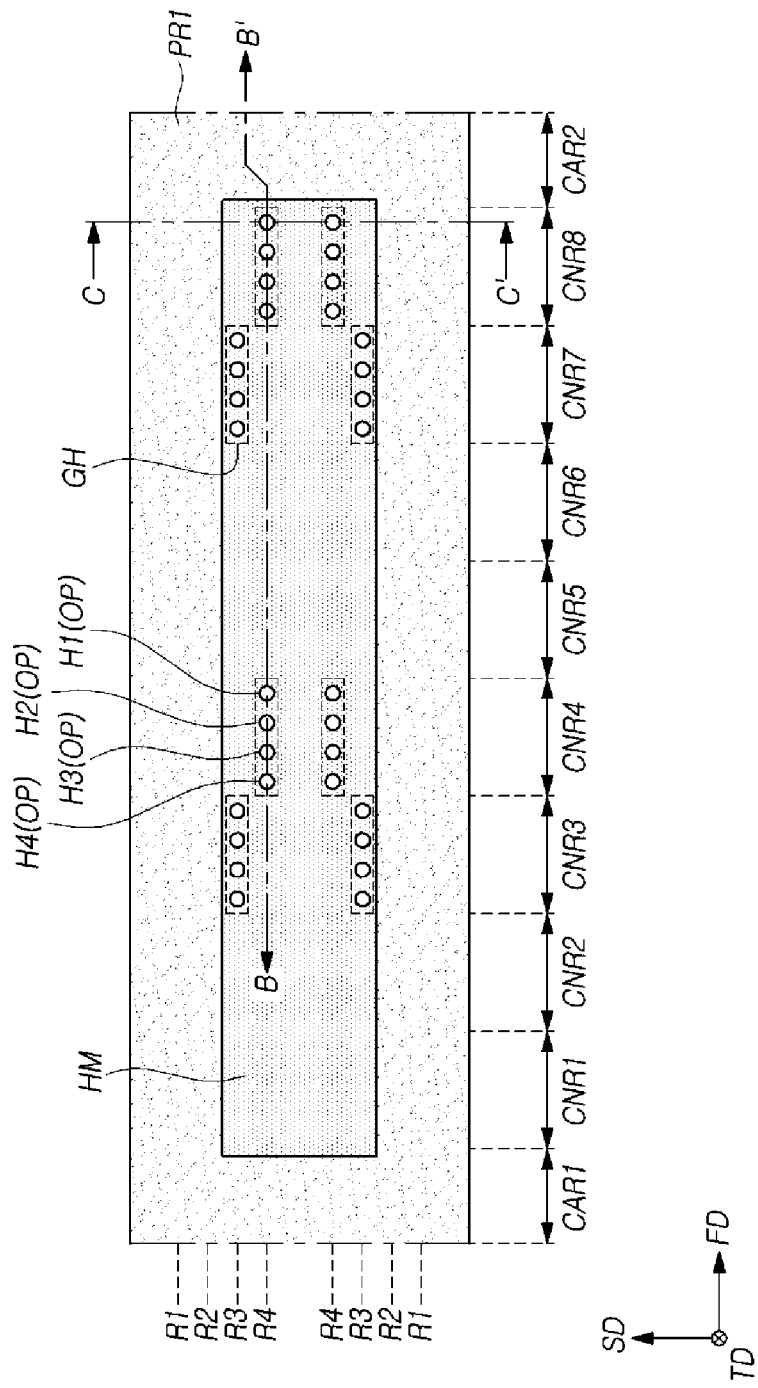
Figure 15B:
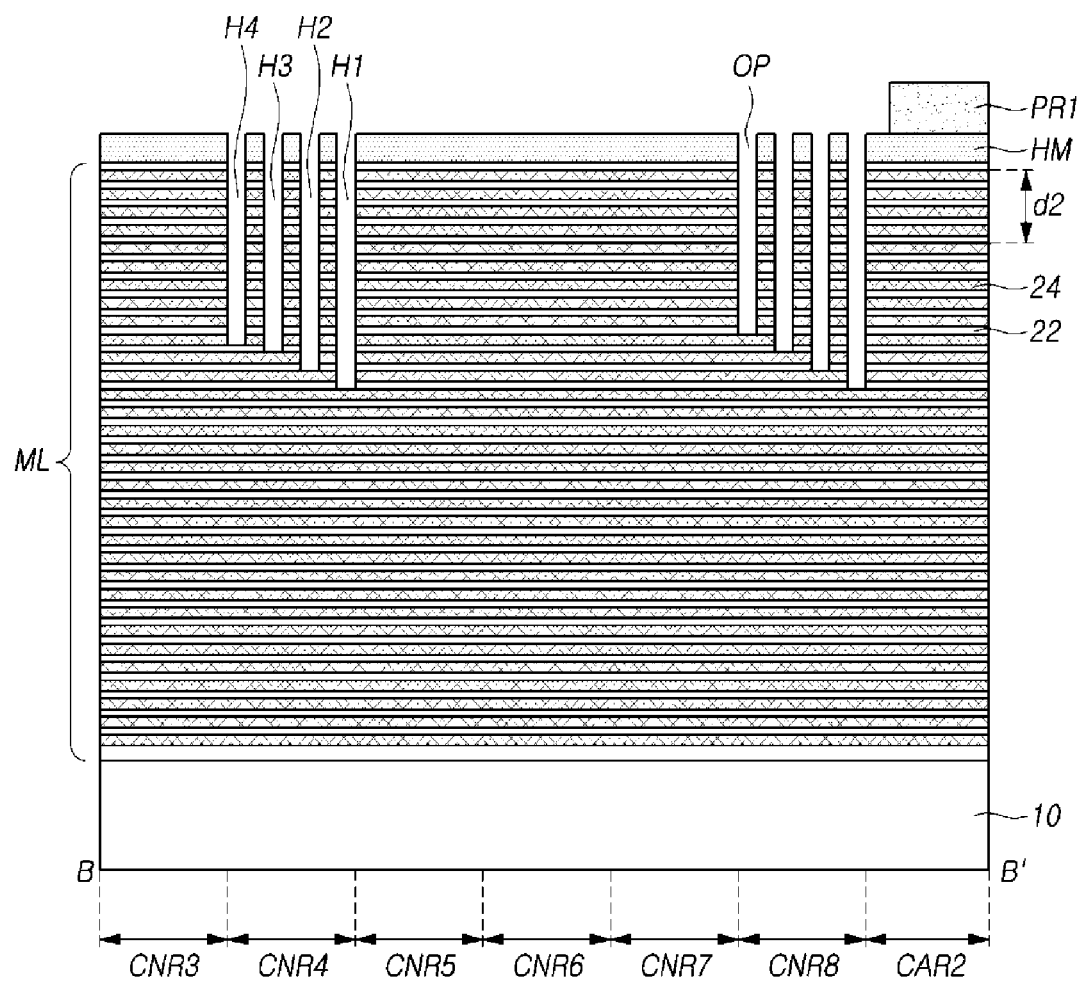
Figure 15C:
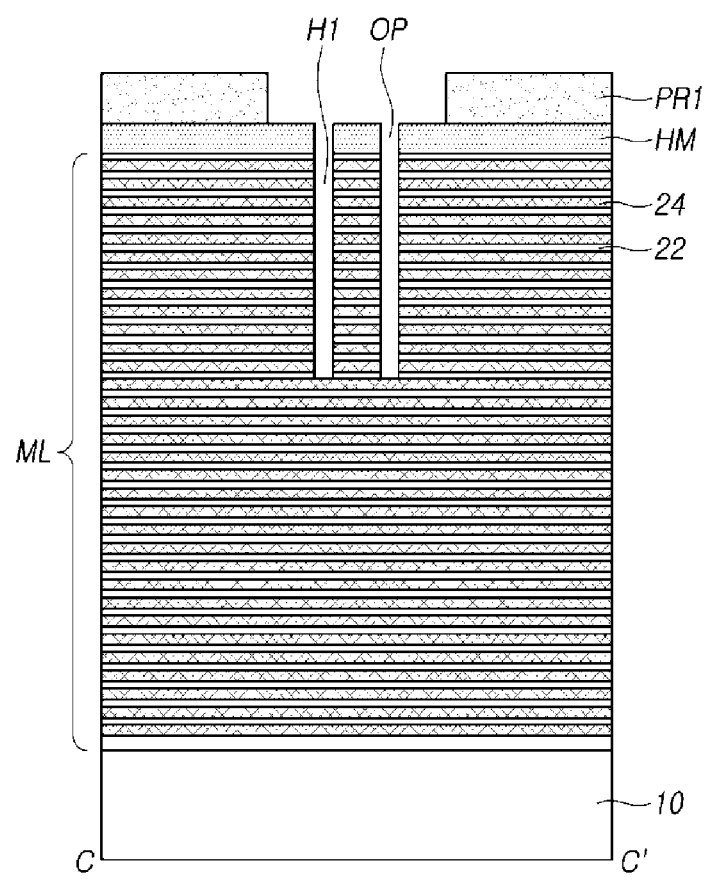

Referring to FIGS. 15A to 15C, a trimming process may be performed for the mask pattern PR1. Namely, an isotropic etching process may be performed for the mask pattern PR1. The trimming process may be performed using an etchant capable of removing the mask pattern PR1 to reduce the height and width of the mask pattern PR1. As the width of the mask pattern PR1 is reduced, the width of the opening may be widened. In an example, the hole groups GH disposed in the third row R3 may be exposed as the area of the mask pattern PR1 is reduced.

The steps described above with reference to FIGS. 14A to 15C may constitute one cycle. That is to say, the cycle may include the recess etching process of etching the stack ML under the opening holes OP exposed by the mask pattern PR1 to a second depth d2, using the mask pattern PR1 and the hard mask pattern HM as an etch mask, and trimming process of reducing the width of the mask pattern PR1 to expose an additional row.

Figure 16A:
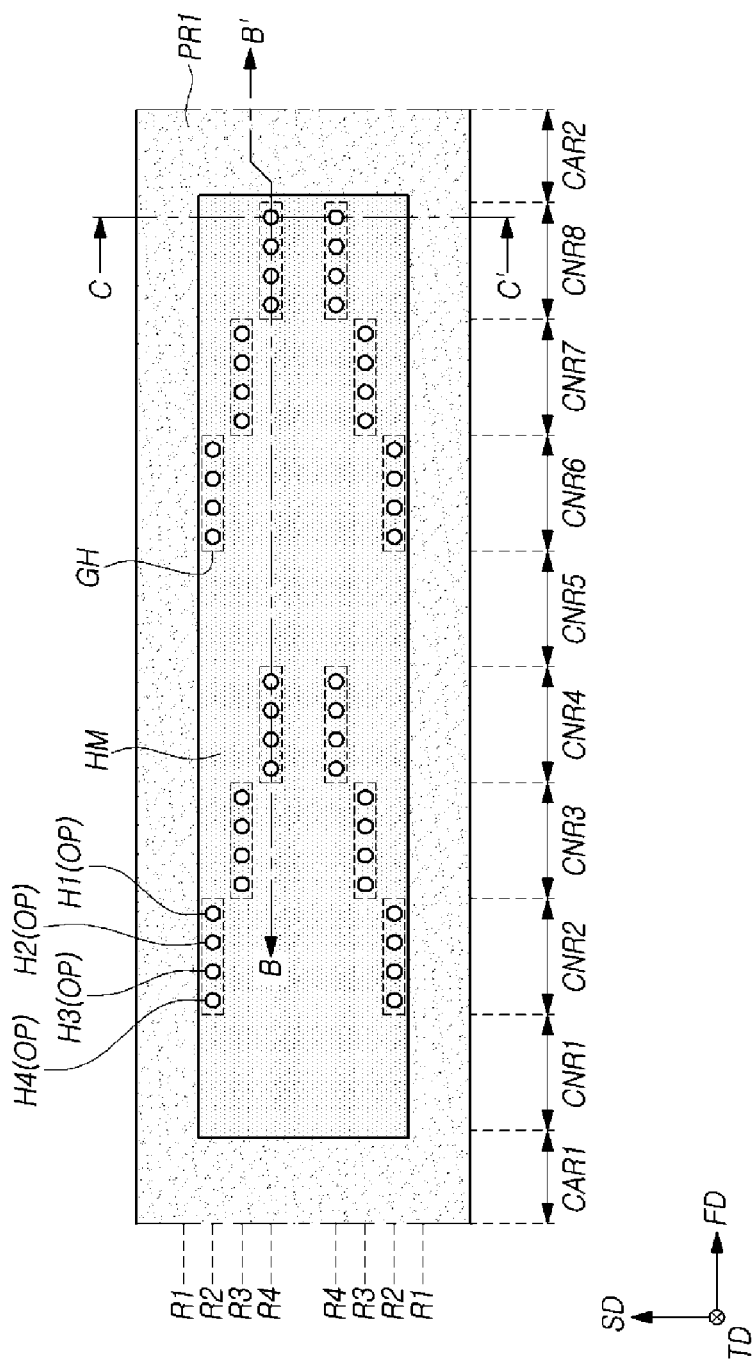
Figure 16B:
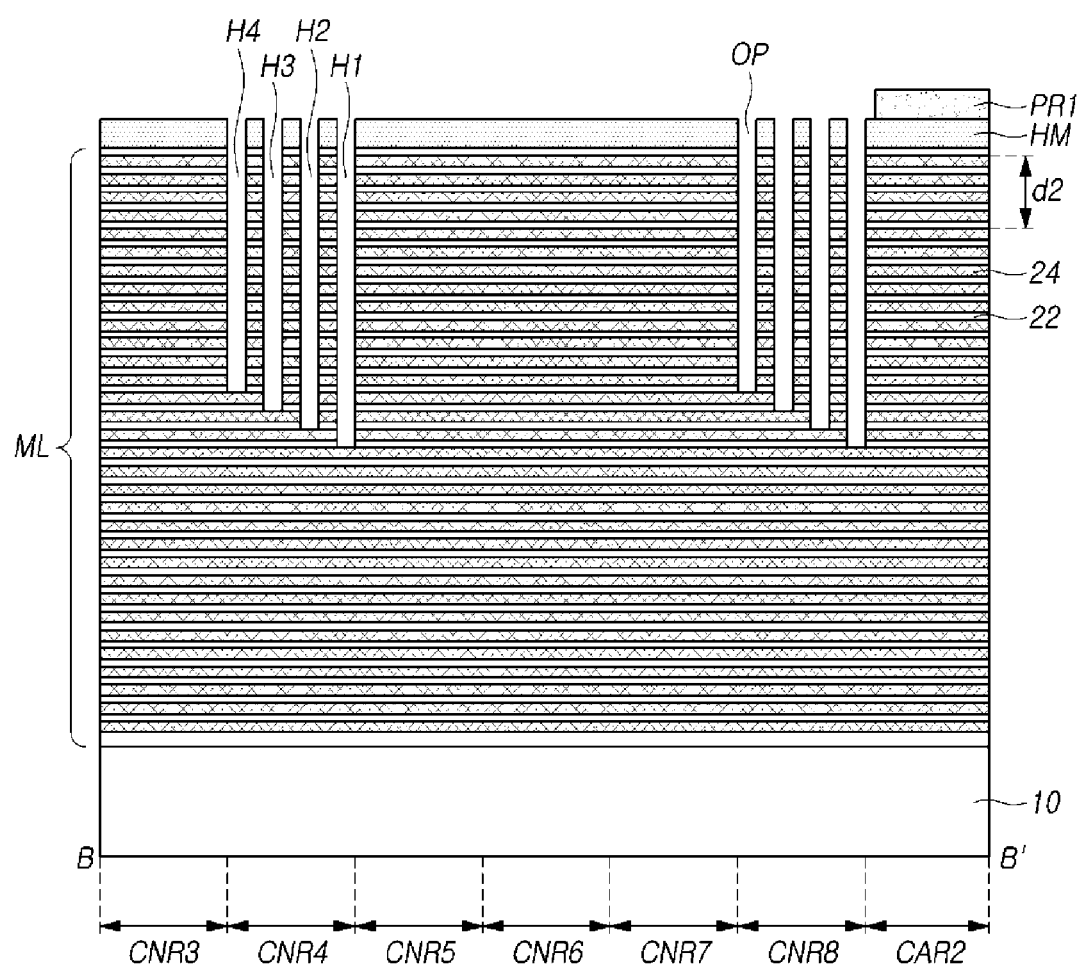
Figure 16C:
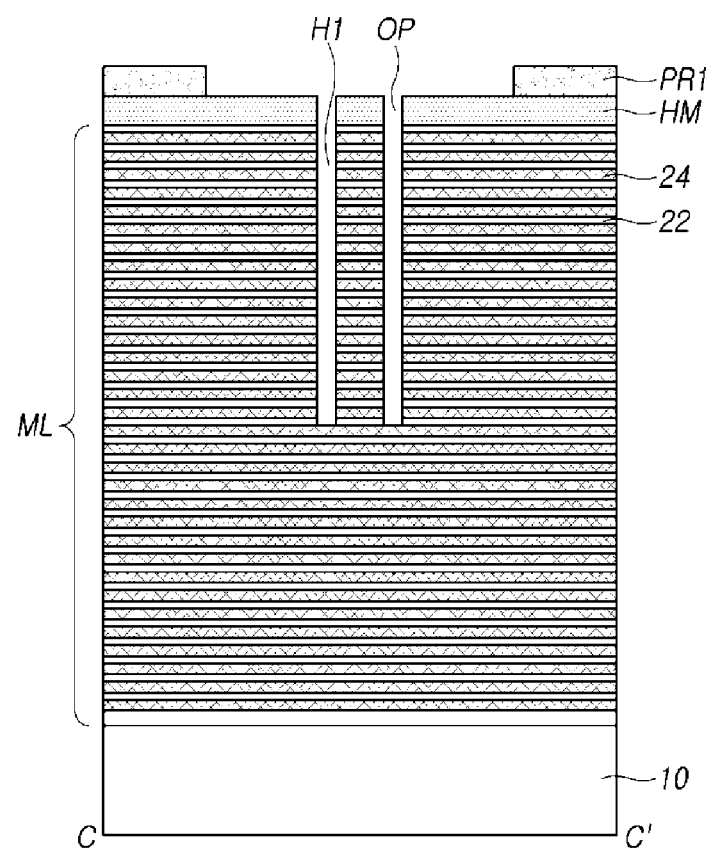

Referring to FIGS. 16A to 16C, the cycle described above may be repeated N times (where N is a natural number of 2 or greater). In an example, N is 3, however, the number of cycles may vary in other embodiments contemplated by the disclosure. If the recess etching process is performed N times in the fourth row R4, then the recess etching process may be performed N−1 times in the next decreasing row number (i.e., row R3). Thus as a row number R # decreases, the number of times by which the recess etching process is performed may also decrease, such that the recess etching process may not be performed in the first row R1.

Figure 17B:
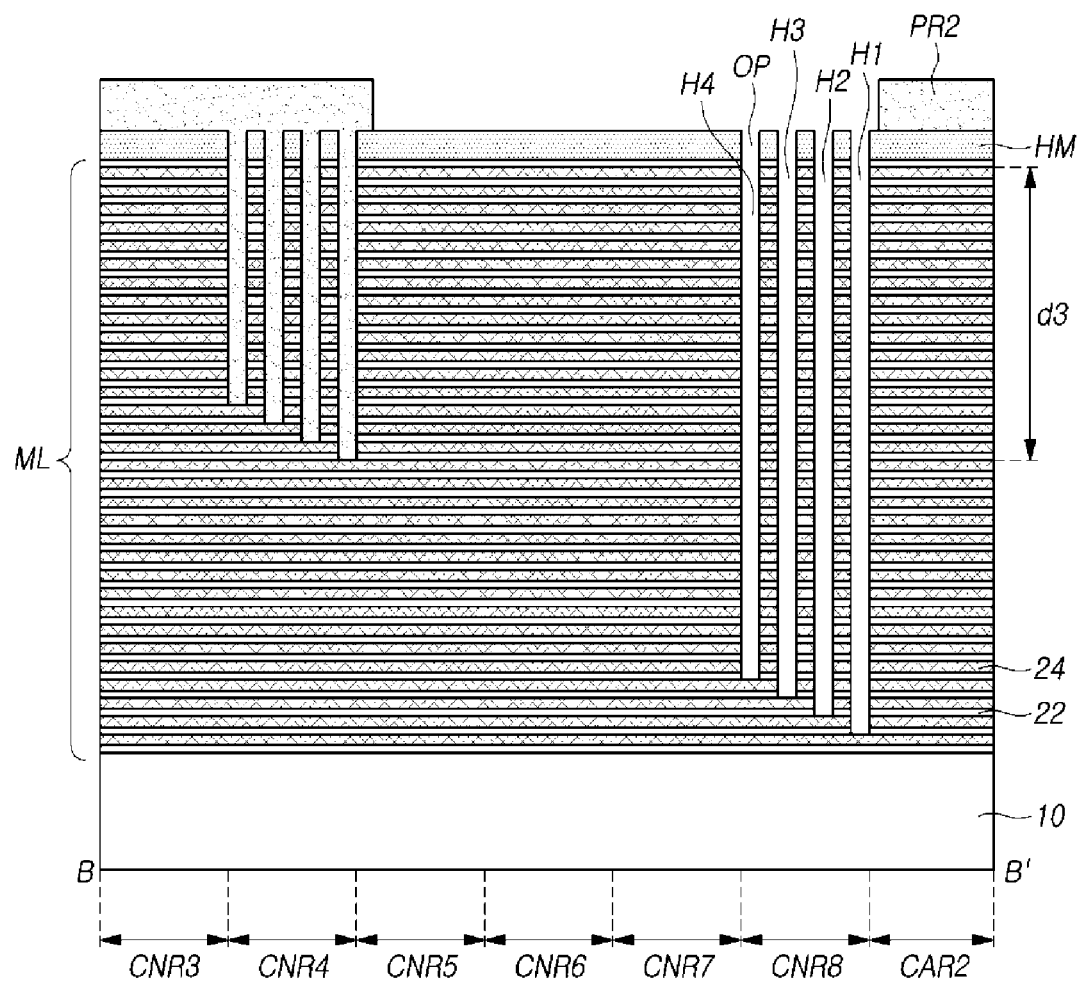

Referring to FIGS. 17A and 17B, a mask pattern PR2 may be formed on the stack ML and the hard mask pattern HM. Some of the coupling areas CNR1 to CNR8 may be exposed by the mask pattern PR2. For example, the fifth to eighth coupling areas CNR5 to CNR8 may be exposed by the mask pattern PR2.

A recess etching process for etching the stack ML using the mask pattern PR2 and the hard mask pattern HM as an etch mask may be performed. The etch depth of the recess etching process may be a third depth d3. The third depth d3 may be M (where M is a natural number of 2 or greater) times the vertical pitch d1. The third depth d3 may be larger than the second depth d2.

Using the second recess etching process, the depths of the contact holes H1 to H4 may be increased in the fifth to eighth coupling areas CNR5 to CNR8. The mask pattern PR2 may be formed using a photolithography process, and may be removed after the recess etching process.

Figure 18A:
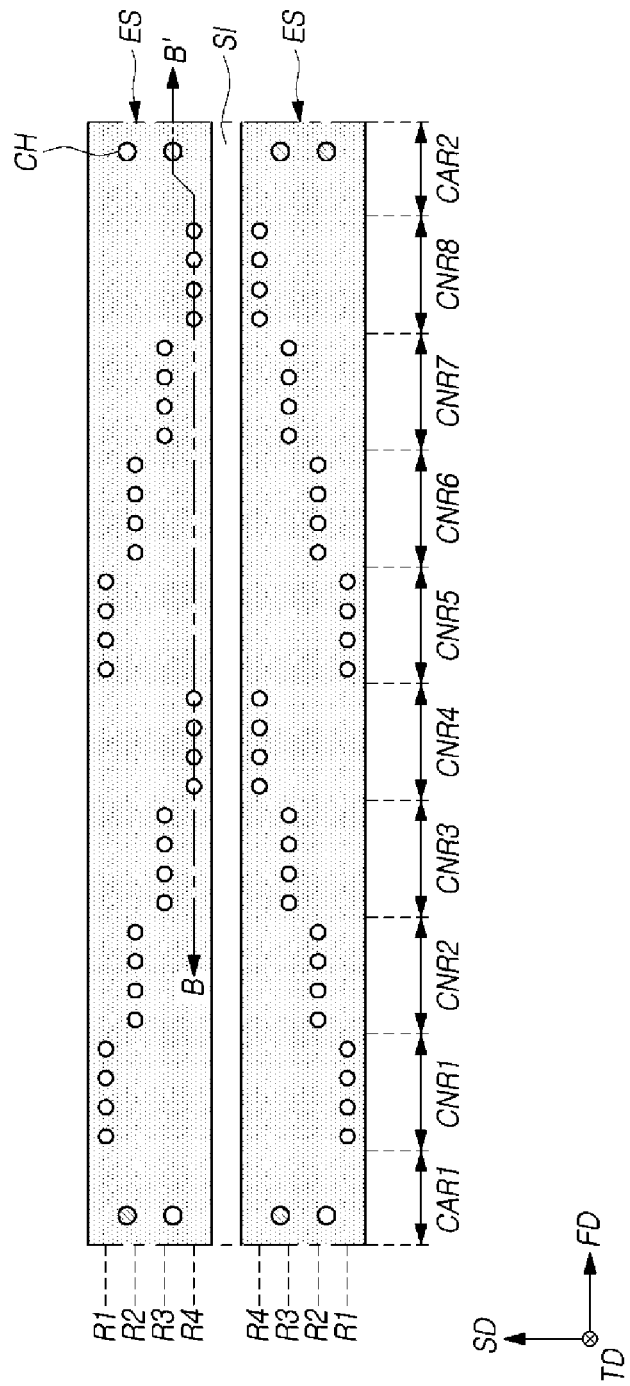
Figure 18B:
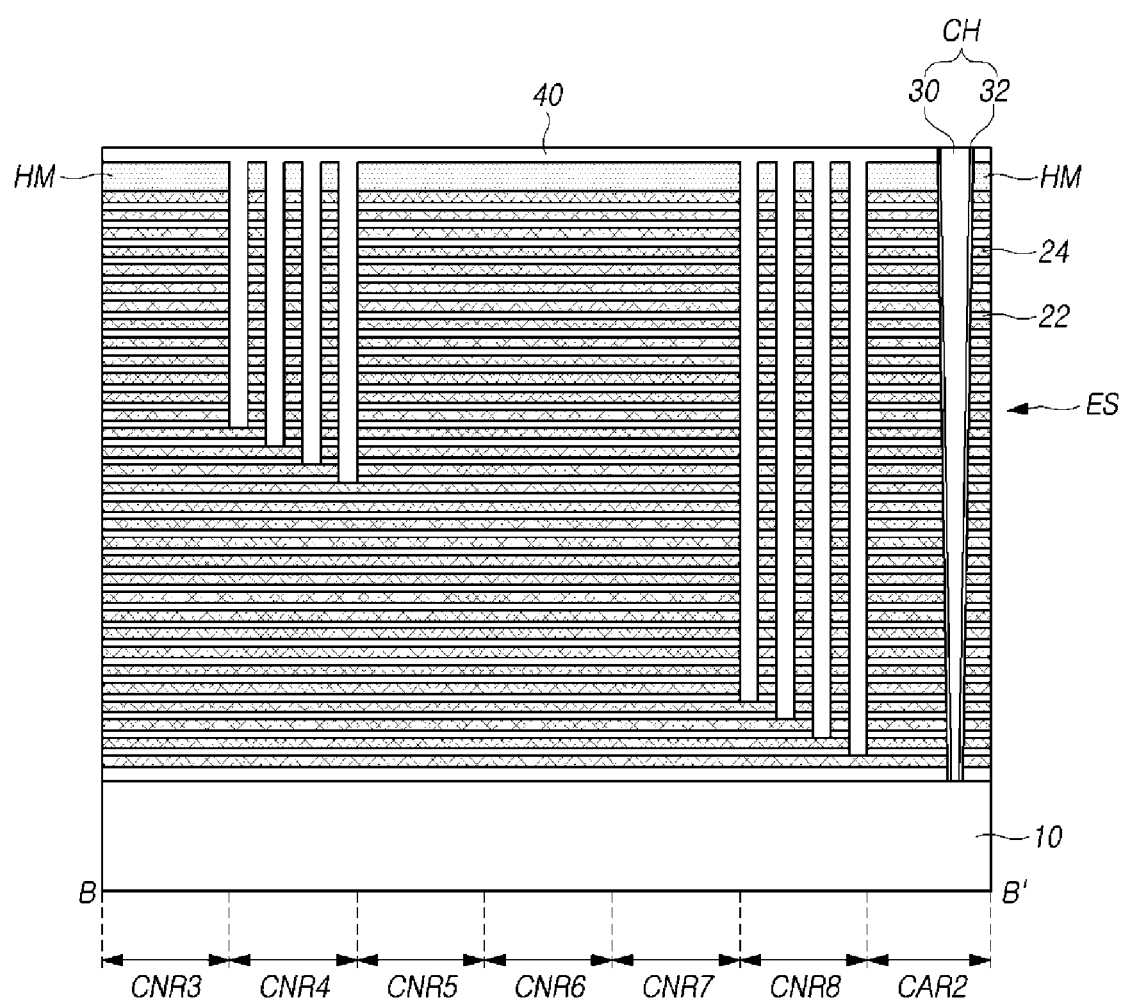

Referring to FIGS. 18A and 18B, a dielectric layer 40 may be formed on the substrate 10, and thereby, may cover the stack ML. The dielectric layer 40 may include silicon oxide, for example, HDP oxide or TEOS oxide. Vertical channels CH which vertically pass through the dielectric layer 40 and the stack ML may be formed in the cell areas CAR1 and CAR2.

A slit SI may be formed through the dielectric layer 40, the hard mask pattern HM and the stack ML through a photolithography process. The slit SI may extend in the first direction FD. The slit SI may divide the dielectric layer 40, the hard mask pattern HM and the stack ML.

While not illustrated, as an etchant is injected through the slit SI, the second material layers 24 which are used as sacrificial layers are removed, and, as a conductive material fills in spaces resulting from the removal of the second material layers 24 to form electrode layers (20 of FIG. 4). In this manner, the second material layers 24 may be replaced with the electrode layers 20. A semiconductor memory device having the structure illustrated in FIGS. 3 and 4 may be defined by a separation pattern (ISP of FIG. 4) formed in the slit SI.

FIGS. 19A to 22A are top views illustrating examples of processing steps of a method for manufacturing a semiconductor memory device. FIGS. 19B to 22B are cross-sectional views taken along the lines D-D' of FIGS. 19A to 22A.

Referring to FIGS. 19A and 19B, a hard mask pattern HM having a plurality of opening holes OP may be formed on a stack ML.

In coupling areas CNR1 to CNR8, the opening holes OP may be continuously disposed in one row in the first direction FD. The embodiment illustrated in the drawing represents regions in which two adjacent electrode structures are formed, and one row of opening holes OP may be provided for each electrode structure forming region. Then, through the unit etching processes described above with reference to FIGS. 10A to 13B, contact holes H with varying depths may be formed in the stack ML.

Figure 20A:
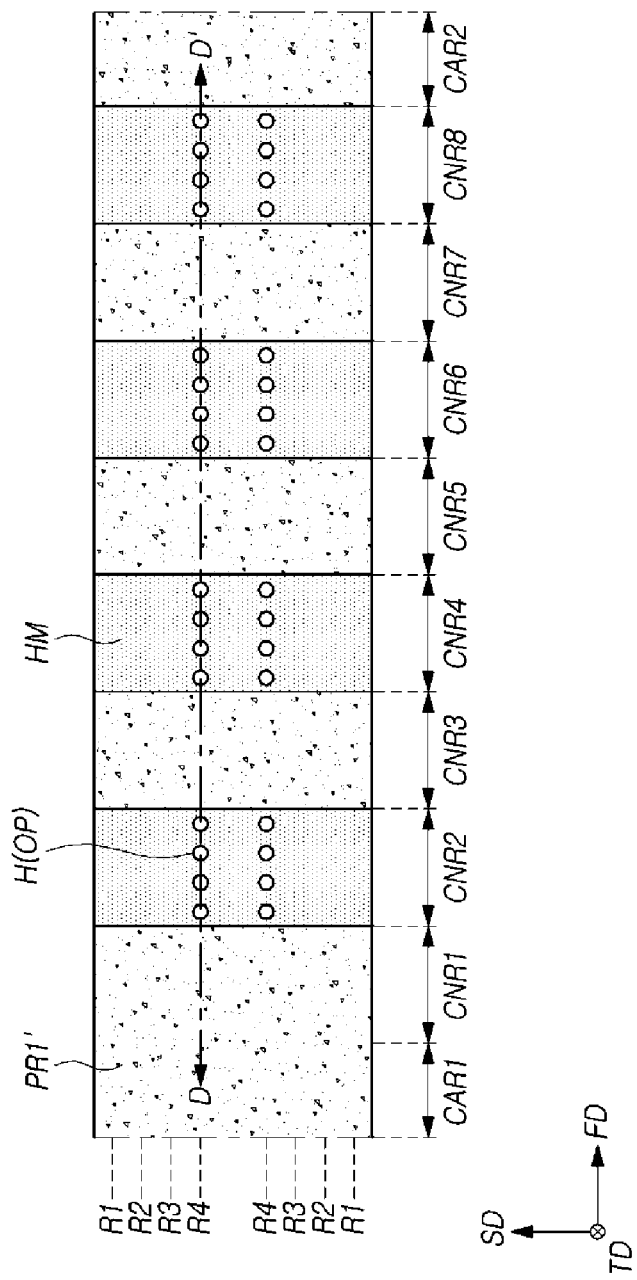
Figure 20B:
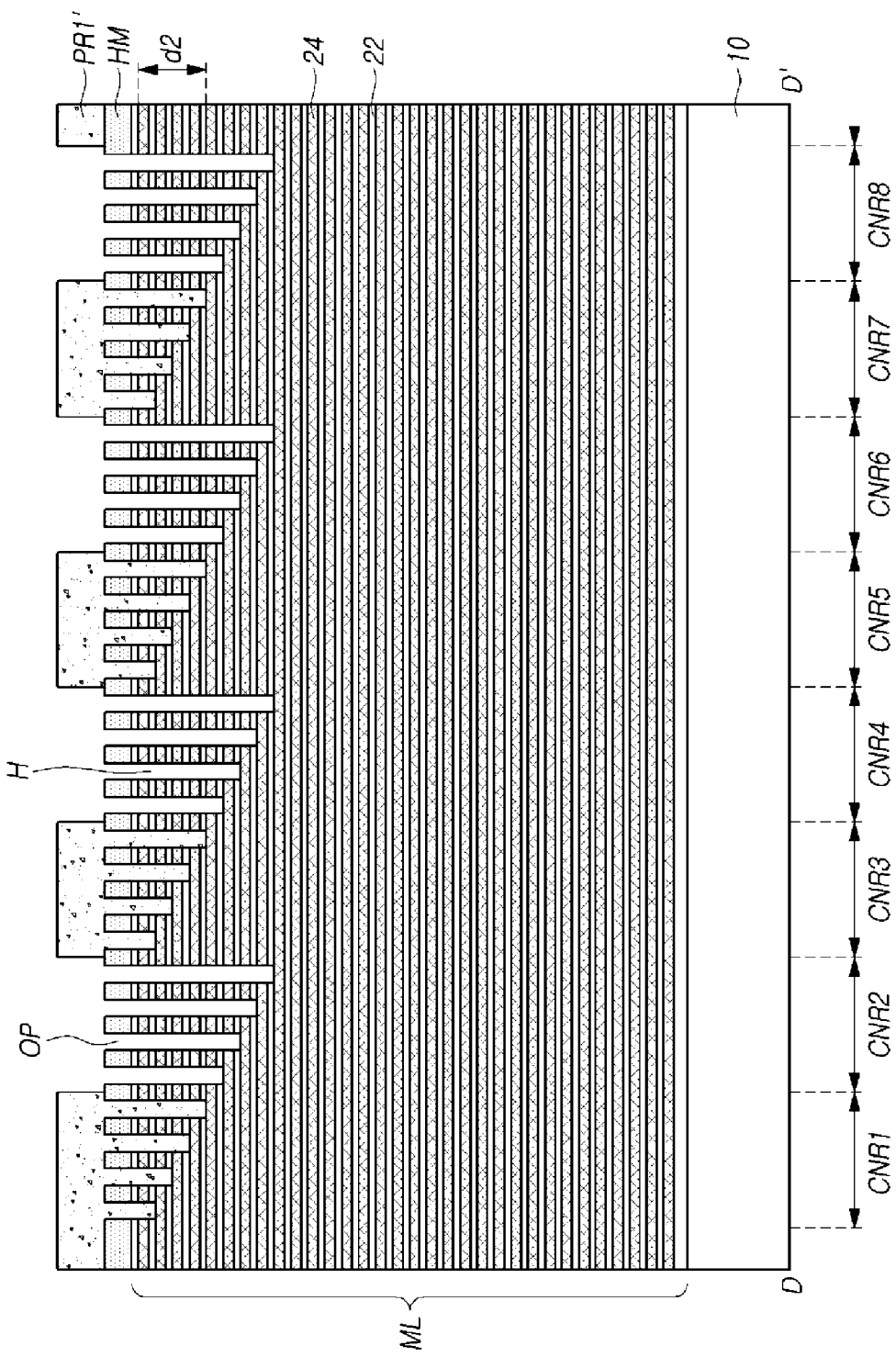

Referring to FIGS. 20A and 20B, a mask pattern PR1' may be formed on the hard mask pattern HM and the stack ML. The mask pattern PR1' may expose some of the coupling areas CNR1 to CNR8, for example, the second, fourth, sixth, and eighth coupling areas CNR2, CNR4, CNR6 and CNR8. In a recess etching process using the mask pattern PR1' and the hard mask pattern HM as an etch mask, the stack ML under the opening holes OP in the second, fourth, sixth and eighth coupling areas CNR2, CNR4, CNR6 and CNR8 may be etched by a second depth d2.

Thus, the contact holes H of the second, fourth, sixth and eighth coupling areas CNR2, CNR4, CNR6 and CNR8 may be deepened by the second depth d2. The mask pattern PR1' may be removed after the first recess etching process.

Figure 21B:
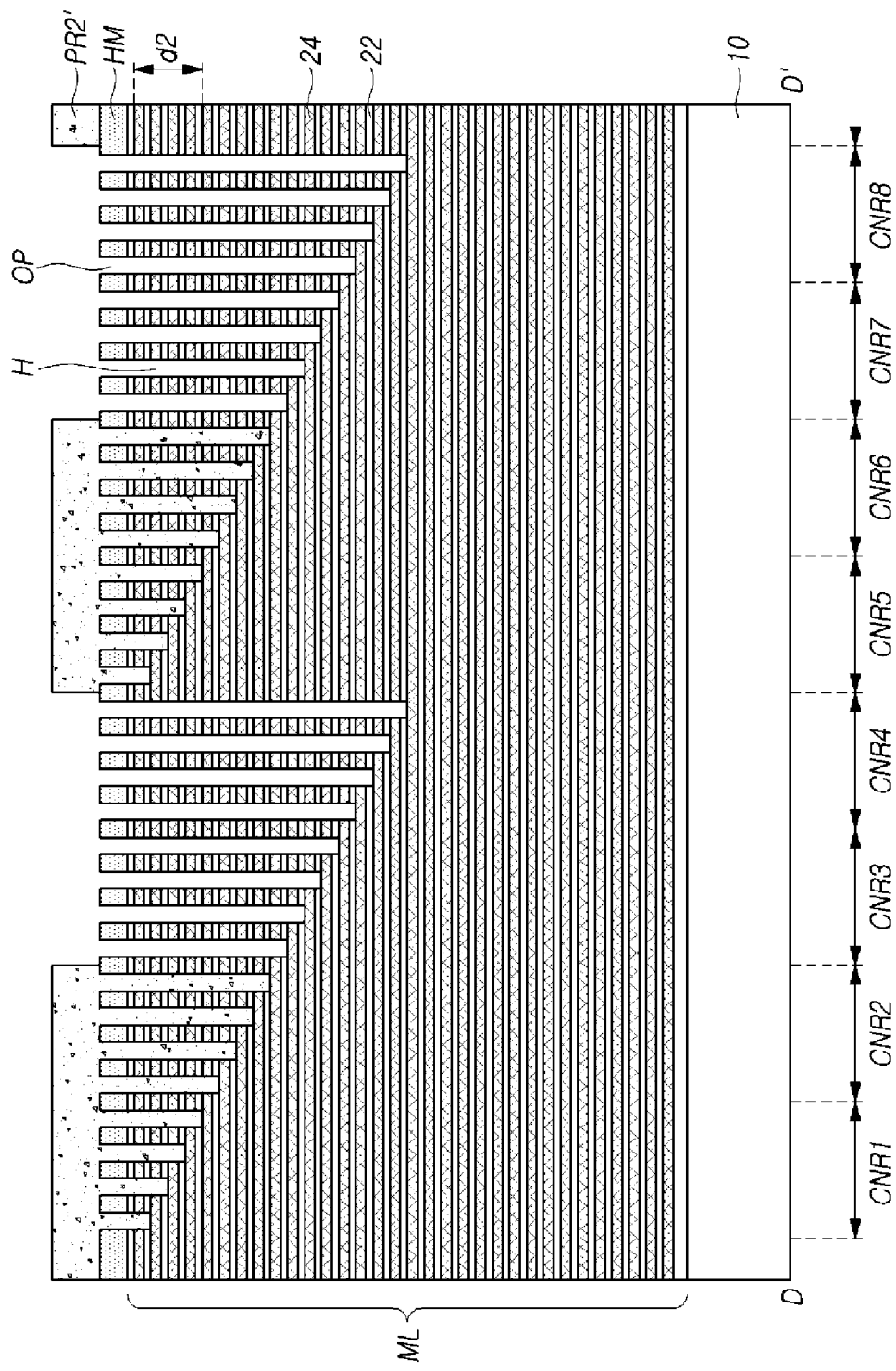

Referring to FIGS. 21A and 21B, a mask pattern PR2' may be formed on the hard mask pattern HM and the stack ML. The opening area of the mask pattern PR2' may be different from the opening area of the mask pattern PR1' used in the process illustrated in FIGS. 20A and 20B. The mask pattern PR2' may expose, for example, the third, fourth, seventh and eighth coupling areas CNR3, CNR4, CNR7 and CNR8. In a recess etching process using the mask pattern PR2' and the hard mask pattern HM as an etch mask, the stack ML under the opening holes OP in the third, fourth, seventh and eighth coupling areas CNR3, CNR4, CNR7 and CNR8 may be etched by the second depth d2. Thus, the contact holes H of the third, fourth, seventh and eighth coupling areas CNR3, CNR4, CNR7 and CNR8 may be deepened by the second depth d2. The mask pattern PR2' may be removed after the recess etching process.

Figure 22A:
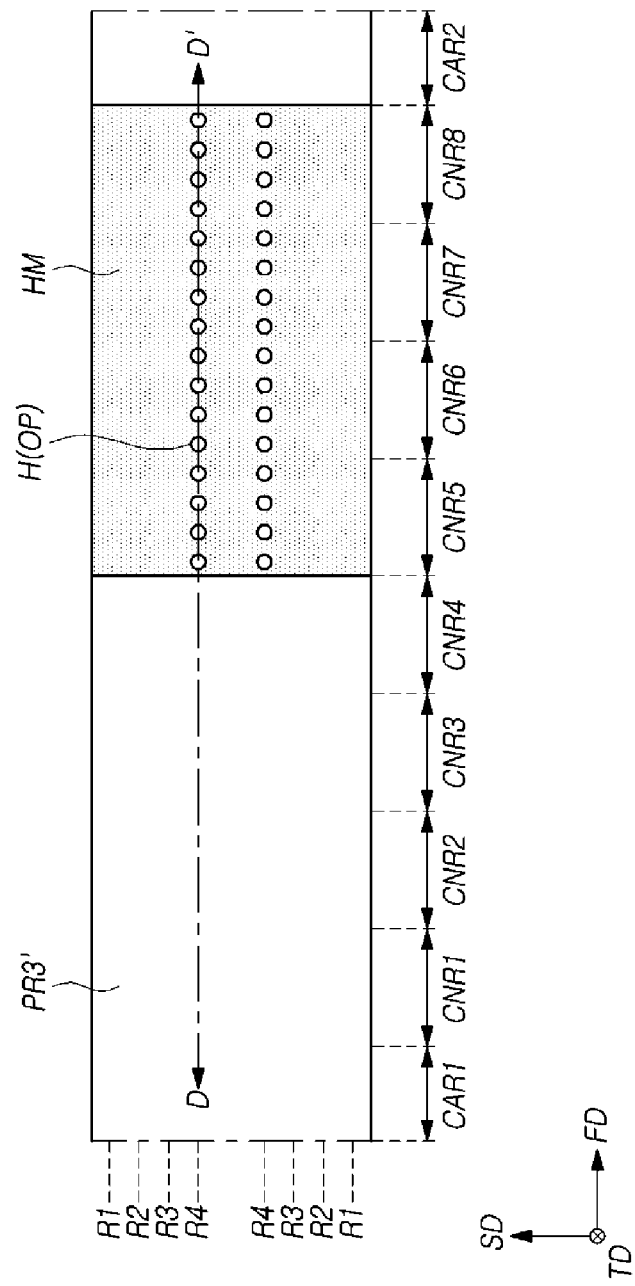
Figure 22B:
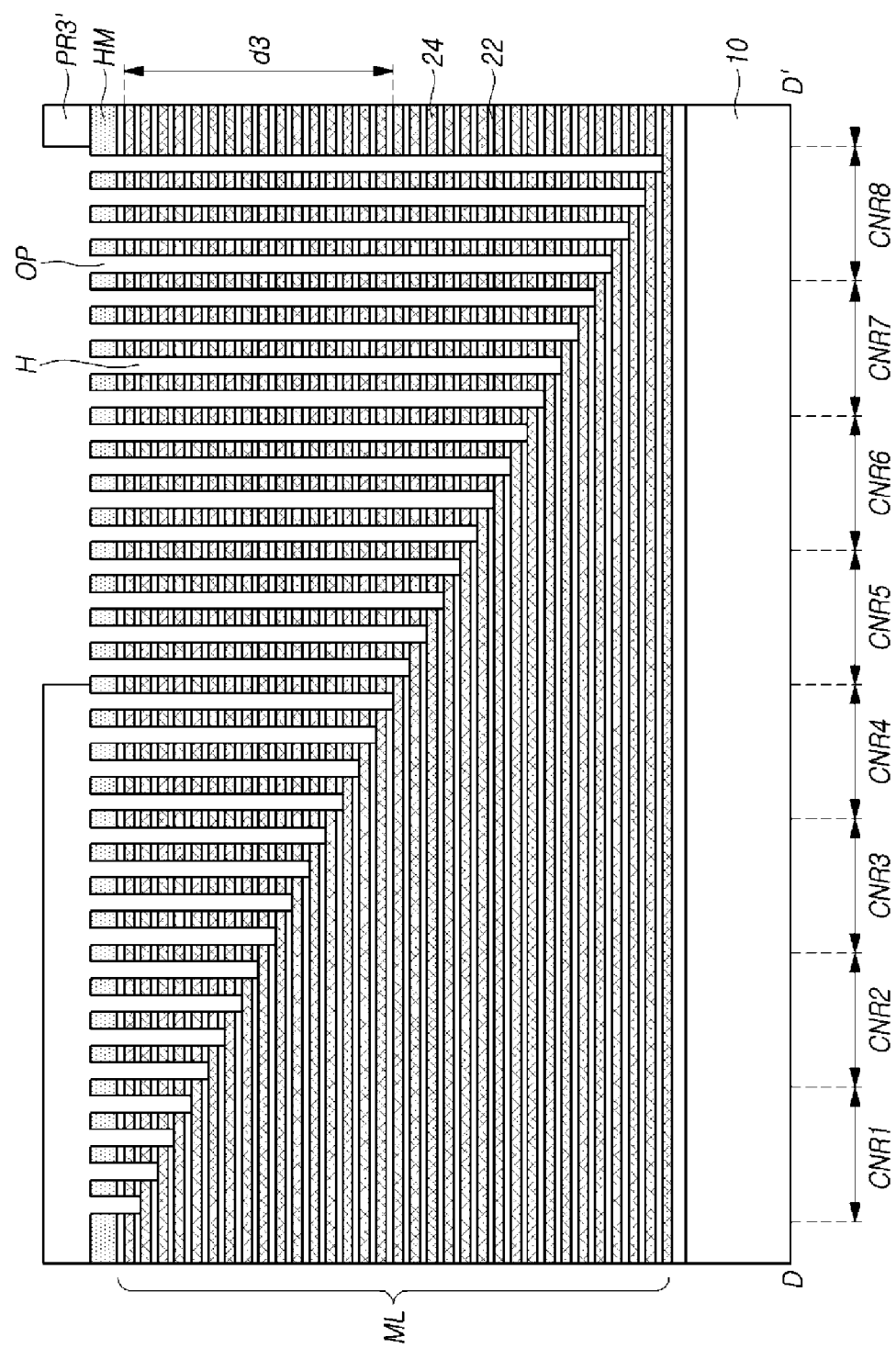

Referring to FIGS. 22A and 22B, a mask pattern PR3' may be formed on the hard mask pattern HM and the stack ML. The opening area of the mask pattern PR3' may be different from the opening areas of the mask patterns PR1' and PR2' used in the processes illustrated in FIGS. 20A to 21B. The mask pattern PR3' may expose, for example, the fifth to eighth coupling areas CNR5 to CNR8. In a recess etching process using the mask pattern PR3' and the hard mask pattern HM as an etch mask, the stack ML under the opening holes OP in the fifth to eighth coupling areas CNR5 to CNR8 may be etched by a third depth d3. The third depth d3 may be larger than the second depth d2. Thus, the contact holes H of the fifth to eighth coupling areas CNR5 to CNR8 may be deepened by the third depth d3. The mask pattern PR3' may be removed after the recess etching process.

As described above, in order to define pad areas (e.g., LP of FIG. 3) in electrode layers (20 of FIG. 4), a method is used in which contact holes H are formed in an upper part of the stack ML and the depths of the contact holes H are increased through repeated recess etching processes.

As described above with reference to FIGS. 19A to 22B, in the case where the opening holes OP of the hard mask pattern HM are disposed in a line in the first direction FD in the coupling areas CNR1 to CNR8, when performing the recess etching processes, a new mask pattern needs to be formed in each recess etching process. In FIGS. 19A to 22B, the three mask patterns PR1', PR2' and PR3' are used in the recess etching processes.

According to an embodiment, as the opening holes OP of the hard mask pattern HM are not disposed in a line and are disposed by being distributed in the plurality of rows R1 to R4 in the coupling areas CNR1 to CNR8, an area exposed by a mask pattern may be changed by only a trimming process. Therefore, it is possible to perform several recess etching processes using one mask pattern. In the embodiment illustrated in FIGS. 14A to 17B, two mask patterns PR1 and PR2 were used in the recess etching processes.

As a result of market factors, buyers are highly sensitive to the price of semiconductor memory devices. Reducing the number of manufacturing steps in a manufacturing process is a very important factor in reducing a manufacturing time and manufacturing costs. Further, by simplifying the process through a reduction in the number of manufacturing steps, it is possible to reduce failures occurring during the manufacturing process.

According to disclosed embodiments, the number of mask patterns used in a process for forming the contact holes H or H1 to H4, which define the pad areas LP, may be reduced. Therefore, manufacturing steps required to form mask patterns may be omitted, and accordingly, the manufacturing time and the manufacturing cost may be reduced, and failures that occur during manufacturing processes may be reduced, thereby contributing to improvement of the yield.

Figure 23:
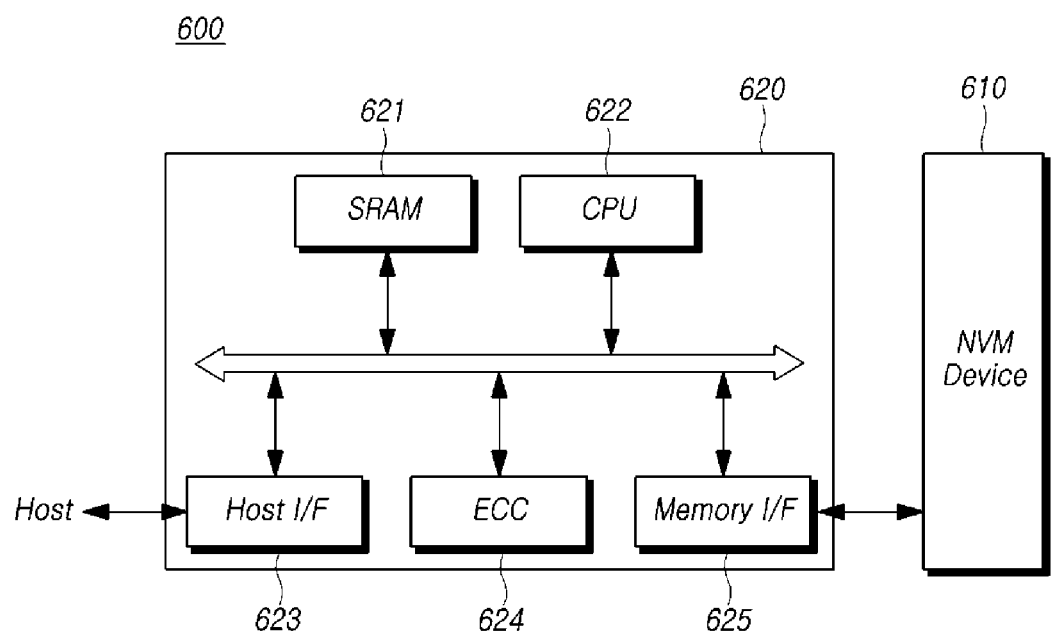
FIG. 23 is a diagram schematically illustrating a memory system including a semiconductor memory device in accordance with an embodiment of the disclosure.

FIG. 23 is a block diagram schematically illustrating an example of a memory system including a semiconductor memory device in accordance with an embodiment of the disclosure.

Referring to FIG. 23, a memory system 600 in accordance with an embodiment of the disclosure may include a nonvolatile memory device 610 and a memory controller 620.

The nonvolatile memory device 610 may be constituted by a semiconductor memory device described above and may operate in the manner described above. The memory controller 620 may be configured to control the nonvolatile memory device 610. The combination of the nonvolatile memory device 610 and the memory controller 620 may be configured as a memory card or a solid state disk (SSD). An SRAM 621 is used as a working memory of a processing unit 622. A host interface 623 includes a data exchange protocol of a host which is coupled with the memory system 600.

An error correction code block 624 detects and corrects an error included in data read from the nonvolatile memory device 610.

A memory interface 625 interfaces with the nonvolatile memory device 610 of the present embodiment. The processing unit 622 performs general control operations for data exchange of the memory controller 620.

Although not shown in the drawing, it is obvious to a person skilled in the art to which the embodiment pertains that the memory system 600 in accordance with the embodiment may be additionally provided with a ROM which stores code data for interfacing with the host. The nonvolatile memory device 610 may be provided as a multi-chip package which is constituted by a plurality of flash memory chips.

The memory system 600 in accordance with the embodiment, described above, may be provided as a storage medium of high reliability, which has a low probability of an error to occur. In particular, the nonvolatile memory device of the present embodiment may be included in a memory system such as a solid state disk (SSD) which is being actively studied recently. In this case, the memory controller 620 may be configured to communicate with an exterior (for example, the host) through one of various interface protocols such as a USB (universal serial bus) protocol, an MMC (multimedia card) protocol, a PCI-E (peripheral component interconnection express) protocol, an SATA (serial advanced technology attachment) protocol, a PATA (parallel advanced technology attachment) protocol, an SCSI (small computer system interface) protocol, an ESDI (enhanced small disk interface) protocol and an IDE (Integrated Device Electronics) protocol.

Figure 24:
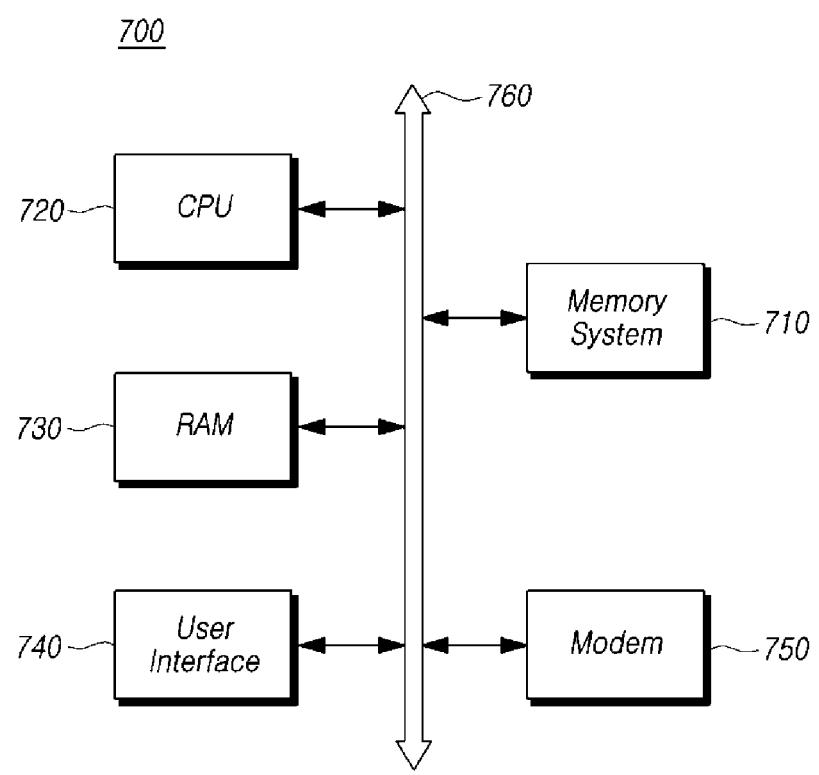
FIG. 24 is a block diagram schematically illustrating a computing system including a semiconductor memory device in accordance with an embodiment of the disclosure.

FIG. 24 is a block diagram schematically illustrating an example of a computing system including a semiconductor memory device in accordance with an embodiment of the disclosure.

Referring to FIG. 24, a computing system 700 in accordance with an embodiment may include a memory system 710, a microprocessor 720, a RAM 730, a user interface 740 and a modem 750 such as a baseband chipset, which are electrically coupled to a system bus 760. In the case where the computing system 700 in accordance with the embodiment is a mobile device, a battery (not shown) for supplying the operating voltage of the computing system 700 may be additionally provided. Although not shown in the drawing, it is obvious to a person skilled in the art to which the embodiment pertains that the computing system 700 in accordance with the embodiment may be additionally provided with an application chipset, a camera image processor (CIS), a mobile DRAM, and so on. The memory system 710 may configure, for example, an SSD (solid state drive/disk) which uses a nonvolatile memory to store data. Otherwise, the memory system 710 may be provided as a fusion flash memory (for example, an OneNAND flash memory).

Although exemplary embodiments of the disclosure have been described for illustrative purposes, those skilled in the art will appreciate that various modifications, additions and substitutions are possible, without departing from the scope and spirit of the disclosure. Therefore, the embodiments disclosed above and in the accompanying drawings should be considered in a descriptive sense only and not for limiting the technological scope. The technological scope of the disclosure is not limited by the embodiments and the accompanying drawings. The spirit and scope of the disclosure may be interpreted in connection with the appended claims and encompass all equivalents falling within the scope of the appended claims.

What is claimed is:

1. A semiconductor memory device comprising:
an electrode structure including a plurality of electrode layers and a plurality of interlayer dielectric layers which are alternately stacked on a substrate defined with a plurality of cell areas and a plurality of coupling areas in a first direction;
a hard mask pattern disposed on the electrode structure, and having a plurality of opening holes in the coupling areas;
a plurality of contact holes defined in the electrode structure under the plurality of opening holes, passing through at least one of the plurality of interlayer dielectric layers and one of the plurality of electrode layers in the electrode structure and exposing pad areas of the plurality of electrode layers, respectively,
a plurality of wiring lines respectively disposed over the plurality of opening holes, and
a plurality of contacts disposed in the plurality of contact holes and to respectively connect the plurality of wiring lines and the pad areas of the plurality of electrode layers,
wherein the plurality of opening holes are distributed in a plurality of rows arranged in a second direction,
wherein structures in the plurality of contact holes consists of the plurality of contacts,
wherein opening holes disposed in the same coupling area and in the same row comprise a hole group,
wherein the opening holes in the hole group are disposed in the first direction,
wherein a plurality of hole groups are disposed in at least one among the plurality of coupling areas, and
wherein the plurality of hole groups are arranged in a zig-zag pattern in the first direction from a plan view.

2. The semiconductor memory device according to claim 1, wherein the plurality of contact holes disposed under the plurality of opening holes of the same hole group are sequentially deepened by a first depth, and wherein the first depth is the same as a vertical pitch of the plurality of electrode layers.

3. The semiconductor memory device according to claim 1,
wherein the plurality of cell areas comprise a first cell area and a second cell area which are disposed in the first direction,
wherein the plurality of coupling areas are disposed between the first cell area and the second cell area, and
wherein the plurality of interlayer dielectric layers and the plurality of electrode layers in the plurality of coupling areas extend continuously in the first direction and the second direction between the first cell area and the second cell area.

4. The semiconductor memory device according to claim 1, wherein the plurality of coupling areas and the plurality of cell areas are alternately disposed in the first direction.

5. The semiconductor memory device according to claim 1, further comprising:
a plurality of vertical channels coupled to the substrate through the electrode structure in the plurality of cell areas.

6. The semiconductor memory device according to claim 1, wherein the vertical channels pass through the hard mask pattern.

7. The semiconductor memory device according to claim 1, further comprising:
separation patterns disposed on both sides of the electrode structure,
wherein the hard mask pattern is separated by the separation patterns, and
wherein, from a plan view, the hole groups are arranged in a diagonal line in the first direction between the separation patterns.

8. The semiconductor memory device according to claim 1, wherein the plurality of contacts do not contact sidewalls of the plurality of contact holes.

9. A semiconductor memory device comprising:
a memory structure disposed over a first substrate; and
a logic structure disposed over a second substrate, and including a logic circuit,
the memory structure comprising:
an electrode structure including a plurality of electrode layers and a plurality of interlayer dielectric layers which are alternately stacked on the first substrate defined with a plurality of cell areas and a plurality of coupling areas in a first direction;
a hard mask pattern disposed on the electrode structure having a plurality of opening holes in the plurality of coupling areas;
a plurality of contact holes defined in the electrode structure under the plurality of opening holes, passing through at least one of the plurality of interlayer dielectric layers and one of the plurality of electrode layers in the electrode structure and exposing pad areas of the plurality of electrode layers, respectively,
a plurality of wiring lines respectively disposed over the plurality of opening holes, and
a plurality of contacts disposed in the plurality of contact holes and to respectively connect the plurality of wiring lines and the pad areas of the plurality of electrode layers,
wherein the plurality of opening holes are disposed by being distributed in a plurality of rows arranged in a second direction intersecting with the first direction,.
wherein structures in the plurality of contact holes consist of the plurality of contacts,
wherein the plurality of opening holes which are disposed in the same coupling area and the same row, among the plurality of opening holes, comprise a hole group,
wherein the plurality of opening holes included in the hole group are disposed in the first direction,
wherein a plurality of hole groups are disposed in at least one among the plurality of coupling areas, and
wherein the plurality of hole groups are arranged in a zig-zag pattern in the first direction from a plan view.

10. The semiconductor memory device according to claim 9, wherein the first substrate is disposed over the logic structure.

11. The semiconductor memory device according to claim 9,
wherein the memory structure comprises a first surface having a plurality of first pads coupled to the plurality of electrode layers through the plurality of contacts disposed in the plurality of contact holes,
wherein the logic structure comprises a second surface having a plurality of second pads which are coupled to the logic circuit, and wherein the second surface of the logic structure is bonded onto the first surface of the memory structure, and the first pads and the second pads are coupled with each other.

12. The semiconductor memory device according to claim 9,
wherein the plurality of contact holes positioned under the plurality of opening holes included in the same hole group are sequentially deepened to a first depth, and
wherein the first depth is the same as a vertical pitch of the plurality of electrode layers.

13. The semiconductor memory device according to claim 10, wherein the plurality of contacts do not contact sidewalls of the plurality of contact holes.

14. The semiconductor memory device according to claim 10,
wherein the plurality of cell areas comprise a first cell area and a second cell area which are disposed in the first direction,
wherein the plurality of coupling areas are disposed between the first cell area and the second cell area, and
wherein the plurality of interlayer dielectric layers and the plurality of electrode layers in the plurality of coupling areas extend continuously in the first direction and the second direction between the first cell area and the second cell area.

* * * * *